(12) United States Patent
Nakaone

(10) Patent No.: US 8,872,038 B2
(45) Date of Patent: Oct. 28, 2014

(54) ANISOTROPIC CONDUCTOR, METHOD OF PRODUCING THE SAME, AND ANISOTROPIC CONDUCTOR-ARRANGED SHEET

(75) Inventor: Yutaka Nakaone, Tokyo (JP)

(73) Assignee: Polymatech Co., Ltd., Tokyo (JP)

( * ) Notice: Subject to any disclaimer, the term of this patent is extended or adjusted under 35 U.S.C. 154(b) by 120 days.

(21) Appl. No.: 13/393,568

(22) PCT Filed: Aug. 25, 2010

(86) PCT No.: PCT/JP2010/064365
§ 371 (c)(1),
(2), (4) Date: Mar. 1, 2012

(87) PCT Pub. No.: WO2011/027692
PCT Pub. Date: Mar. 10, 2011

(65) Prior Publication Data
US 2012/0152593 A1    Jun. 21, 2012

(30) Foreign Application Priority Data

Sep. 2, 2009   (JP) ................................. 2009-202600

(51) Int. Cl.
| H05K 1/03 | (2006.01) |
| H01L 23/498 | (2006.01) |
| H05K 3/32 | (2006.01) |
| H01R 43/00 | (2006.01) |

(52) U.S. Cl.
CPC .......... *H05K 3/32* (2013.01); *H01L 2924/0002* (2013.01); *H01L 23/49894* (2013.01); *H05K 2201/10378* (2013.01); *H05K 2201/0133* (2013.01); *H01R 43/007* (2013.01); *H05K 2201/083* (2013.01); *H01L 23/49827* (2013.01); *H05K 2201/10962* (2013.01); *H05K 2203/104* (2013.01)

USPC ........................................... 174/255; 174/262

(58) Field of Classification Search
CPC ................... H01L 23/49827; H01L 23/49894; H01L 2924/0002; H05K 3/32; H05K 2201/0133; H05K 2201/083; H05K 2201/10378; H05K 2201/10962; H05K 2203/104; H05K 3/323; H05K 3/321; H01R 2201/031; H01R 43/007; H01R 4/04; H01R 13/2414; H01R 13/24

See application file for complete search history.

(56) References Cited

U.S. PATENT DOCUMENTS 5,891,366 A * 4/1999 Gruenwald et al. .......... 252/514
6,969,622 B1 * 11/2005 Kokubo et al. ................. 438/14

(Continued)

FOREIGN PATENT DOCUMENTS

| JP | 06-140089 A | 5/1994 |
| JP | 2000-168000 A | 6/2000 |

(Continued)

OTHER PUBLICATIONS

International Search Report for PCT Patent App. No. PCT/JP2010/064365 (Nov. 9, 2010).

*Primary Examiner* — Ishwarbhai B Patel

(74) *Attorney, Agent, or Firm* — Cermak Nakajima & McGowan LLP; Tomoko Nakajima

(57) ABSTRACT

To provide a technique by which a material exhibiting high adhesiveness to objects to be fixed can be selected regardless of a material used for an insulating base in an anisotropic conductor having an adhesive section. An intermediate sheet which can be attached to the base is provided between the base and adhesive section. Since the intermediate sheet is provided in this manner, adhesive materials that exhibit high adhesive force to objects to be fixed can be used for the adhesive section without the consideration for adhesive force to the base. Furthermore, adhesive force which cannot be exhibited between the adhesive section and the base in the case of direct contact of the adhesive section with the base can be exhibited.

13 Claims, 14 Drawing Sheets

(56) References Cited

U.S. PATENT DOCUMENTS

| | | | |
|---|---|---|---|
| 7,095,241 B2 * | 8/2006 | Setaka et al. | 324/755.05 |
| 7,156,669 B2 * | 1/2007 | Asai et al. | 439/91 |
| 7,267,559 B2 * | 9/2007 | Hashitani et al. | 439/91 |
| 7,537,459 B2 * | 5/2009 | Takegahara et al. | 439/66 |
| 7,690,932 B2 * | 4/2010 | Nakaone | 439/91 |
| 8,008,582 B2 * | 8/2011 | Shimada | 174/257 |
| 8,124,885 B2 * | 2/2012 | Yamada et al. | 174/265 |
| 2007/0249161 A1 | 10/2007 | Nakaone | |
| 2009/0081419 A1 | 3/2009 | Idomoto et al. | |
| 2009/0159325 A1 | 6/2009 | Yamada et al. | |

FOREIGN PATENT DOCUMENTS

| | | |
|---|---|---|
| JP | 2002-373716 A | 12/2002 |
| JP | 2006-147323 A | 6/2006 |
| JP | 2006-278014 A | 10/2006 |
| JP | 2007-026922 A | 2/2007 |
| JP | 2007-294161 A | 11/2007 |
| WO | WO2007/116826 A1 | 10/2007 |

* cited by examiner (A)

(B)

(C)

ANISOTROPIC CONDUCTOR, METHOD OF PRODUCING THE SAME, AND ANISOTROPIC CONDUCTOR-ARRANGED SHEET

This application is a national phase entry under 35 U.S.C. §371 of PCT Patent Application No. PCT/JP2010/064365, filed on Aug.25, 2010, which claims priority under 35 U.S.C. §119 to Japanese Patent Application No. 2009-202600, filed Sep.2, 2009, both of which are incorporated by reference.

TECHNICAL FIELD

The present invention relates to an anisotropic conductor, a method of producing the anisotropic conductor, and application of the anisotropic conductor. The anisotropic conductor is incorporated in the inside of various types of electronic equipment including information-processing equipment such as cellular phones, personal handyphone systems (PHS), personal digital assistants (PDAs), and laptops; and audio and visual (AV) equipment such as portable audio players and serves for electric connection between various types of components and members, for example between circuit boards, a circuit board and an electronic component, or a conductive section provided to the exterior component of a device and a circuit board.

BACKGROUND ART

As illustrated in FIGS. 40 and 41, an anisotropic conductive sheet 1, which is an example of an anisotropic conductor, has a base 2 produced by using an insulating elastic sheet, and the base 2 has conductive sections 3 formed so as to penetrate the base 2 in the thickness direction. The anisotropic conductive sheet 1 has an anisotropic property in which conductors 3 enable electric connection to be formed in the thickness direction of the base 2 but the electric connection cannot be formed in the other directions of the base 2. In the case of attaching the anisotropic conductive sheet 1 to electronic equipment, the need to conduct soldering and mechanical bonding is eliminated, and conductive connection can be easily formed between components or members as a result of pressing conductive contacts 3a, in which the conductive sections 3 are exposed, against the contacts (electrodes) of the components or members. Furthermore, since the base 2 that holds the conductive sections 3 is formed by using a rubber elastic material, the base 2 can also absorb external oscillation and shock.

Even though the contacts of a component or member are aligned with the conductive contacts 3a of the anisotropic conductive sheet during manufacturing of electronic equipment, unfortunately, a problem has arisen, in which the anisotropic conductive sheet 1 easily become misaligned in a process of completely attaching the anisotropic conductive sheet 1. In order to solve this problem, an anisotropic conductive sheet 5 has been proposed in Japanese Unexamined Patent Application Publication No. 2007-294161 (Patent Literature 1), in which adhesive sections 4 are formed around the conductive sections 3 so as to be spaced apart from the conductive sections 3 and have adhesive surfaces 4a that are formed so as to be flush with the conductive contacts 3a of the conductive sections 3 as illustrated in FIGS. 42 and 43.

Owing to the technique disclosed in the Patent Literature 1, the adhesive sections 4 can serve to temporarily fix the anisotropic conductive sheet 5, and the electrodes of a circuit board or the like are aligned with the conductive contacts 3a of the anisotropic conductive sheet 5, so that the anisotropic conductive sheet 5 can be prevented from being misaligned even though some oscillation and shock are applied during manufacturing of electronic equipment. Since the conductive contacts 3a of the conductive sections 3 are formed so as to be flush with the adhesive surfaces 4a of the adhesive sections 4, the conductive sections 3 and adhesive sections 4 simultaneously contact with an adherend such as the exterior of a circuit board or electronic equipment in the case of bonding the anisotropic conductive sheet 5 to the adherend. Conductive connection can be therefore steadily secured.

CITATION LIST

Patent Literature

PTL 1: Japanese Unexamined Patent Application Publication No. 2007-294161

SUMMARY OF INVENTION

Technical Problem

The anisotropic conductive sheet 5 disclosed in the Patent Literature 1, however, has a problem in which an adhesive material used for the adhesive sections 4 strongly adheres to the base 2 because the base 2 is formed by using a rubber elastic material whereas the adhesive material has weak adhesiveness to objects to be fixed, such as circuit boards and metallic cases. For example, in the case of forming the base 2 from silicone rubber, although a silicone-based adhesive material which strongly adheres to silicone rubber is used as the adhesive material, the silicone rubber has weak adhesiveness to a circuit board or metallic case. In addition, such silicone rubber easily causes the problematic misalignment and removal after temporal fixing.

Embodiments of the invention have been made in order to overcome such disadvantages. In particular, it is an object of the invention to provide a technique which enables an adhesive material to be selected regardless of the type of a material used for a base and which enables high adhesiveness to be exhibited to objects to be fixed.

Solution to Problem

In order to provide the above advantage, an insulating base that is formed by using a rubber elastic material; a conductive section that penetrates the base in the thickness direction, the conductive section being exposed from the base to form a conductive contact; and an adhesive section that is exposed from the conductive contact-formed surface of the base to form an adhesive surface. In the anisotropic conductor, an intermediate sheet is provided between the base and the adhesive section, the intermediate sheet having adhesiveness to the base.

The anisotropic conductor has the intermediate sheet provided between the base and the adhesive section, and the intermediate sheet adheres to the base. If the intermediate sheet is not provided, in the case of bringing the anisotropic conductor into contact with objects to be fixed even though the adhesive section strongly adheres to the object to be fixed whereas the adhesive section has the weak adhesive force to the base, the adhesive section keeps tightly sticking to the object to be fixed, such as circuit boards and metallic cases, and adhesive force between the object to be fixed and the anisotropic conductor may finally become weak. This phenomenon results from the difficulty to produce an adhesive material having high adhesiveness to the base formed by using a rubber elastic material. To the contrary, in the case of using the intermediate sheet, an adhesive material can be used, which can exhibit adhesiveness to the intermediate sheet to which the base and different materials can adhere even though the adhesive material has weak adhesiveness to the base. In other words, an intermediate sheet that exhibits adhesiveness to specific adhesive materials can be selected. In particular, an adhesive material having high adhesive force to objects to be fixed can be selected to form the adhesive section, and an anisotropic conductor which is less likely to cause misalignment with and removal from objects to be fixed can be provided. Moreover, since the intermediate sheet adheres to the base, the hardness of the intermediate sheet can make the base difficult to deform, so that the anisotropic conductor can be easily treated.

The intermediate sheet can be formed by using a heat-resistant curing resin which exhibits a deflection temperature under load of 170° C. or higher, the temperature being measured in accordance with JIS K 7191. Owing to such formation, the intermediate sheet can be prevented from thermally deforming, and an anisotropic conductor with reduced deformation, such as flexure and deflection, and with high dimensional accuracy can be provided. Meanwhile, JIS K 7191 refers to deflection temperature under load. The term "deflection temperature under load" means the deflection temperature under load which is measured in accordance with JIS K 7191, if not otherwise specified.

The adhesive section can be formed by using an adhesive tape having adhesive layers which are individually formed on the two sides of a substrate. The adhesive tape which utilizes a resin film or nonwoven cloth as the substrate and has adhesive layers individually formed on the two sides thereof is a so-called both-sided tape. This type of tape has a high shape-retaining property owing to the hardness of the substrate and can be therefore easily treated. In the case of using an adhesive tape for the adhesive section, the hardness of the substrate of the adhesive tape can make the base difficult to deform, so that the anisotropic conductor can be easily treated.

The adhesive tape is formed so as to have a through-hole at a position corresponding to the conductive section, and the adhesive tape therefore does not interrupt the conductive section. The anisotropic conductor can be provided, which can stably secure conductive connection without interruption of the conductive connection of the conductive section.

The adhesive surface can be formed so as to be flush with the conductive contact. By virtue of such a structure, the surface of the anisotropic conductor can uniformly contact with the surfaces of object to be fixed without formation of gaps. Consequently, the conductive contact can serve to stably secure conductive connection, and the adhesive surface enables excellent adhesive force to be exhibited.

There is provided a method of producing an anisotropic conductor including an insulating base that is formed by using a rubber elastic material, a conductive section that penetrates the base in the thickness direction and that is exposed from the base to form a conductive contact, an adhesive section that is exposed from the conductive contact-formed surface of the base to form an adhesive surface, and an intermediate sheet that is provided between the base and the adhesive section and that exhibits adhesiveness to the base. The method includes a process of forming a first processing sheet having a structure in which a thickness-adjusting sheet is stacked on the intermediate sheet, the first processing sheet having a through-hole that penetrates the both sheets in the thickness direction; a process of inserting the first processing sheet into a mold in which an orientation pin is embedded, while the through-hole is aligned with the orientation pin of the mold and the thickness-adjusting sheet faces the mold; a process of putting a liquid rubber composition containing a magnetic conductor into the mold, applying a magnetic field to the mold in order to form the conductive section that extends through the through-hole, and then heating the mold to cure the liquid rubber composition with the result that the base is integrated with the first processing sheet; and a process of removing the thickness-adjusting sheet and then providing the adhesive section in a region formed by the removal.

In this production method, the first processing sheet having a layered structure of the intermediate sheet and thickness-adjusting sheet is integrated with the base, and then the thickness-adjusting sheet is removed to form the adhesive section at a region formed by the removal. Accordingly, a space corresponding to the adhesive section can be secured in the formation of the base, and a region in which the adhesive section is provided can be accurately formed in the anisotropic conductor.

If the adhesive section is inserted into a mold used for forming the base and the base is then thermally cured, the adhesive section can be integrated with the base. Unfortunately, the heat decreases the adhesive force of the adhesive section. Since the adhesive section is formed after the base is integrated with the intermediate sheet, however, the adhesive section is free from the effect of the heating during curing the base in the mold. The adhesive force of the adhesive section can be prevented from decreasing during the production process.

The adhesive section can be formed in the space formed as a result of removing the thickness-adjusting sheet, and the conductive section can therefore protrude from the adhesive section as a result of forming the adhesive section having a thickness smaller than that of the thickness-adjusting sheet. Furthermore, in the case of forming the adhesive section having a thickness approximately the same as that of the thickness-adjusting sheet, the conductive contact of the conductive section can be formed so as to be flush with the adhesive surface of the adhesive section.

In this case, primer is applied onto the base-facing surface of the intermediate sheet (adhesive surface), thereby enhancing the adhesiveness of the intermediate sheet to the base.

In the production method, a second processing sheet in which a sealing sheet is stacked on the thickness-adjusting sheet of the first processing sheet is used, and the sealing sheet can be removed together with the thickness-adjusting sheet in the process of forming the adhesive section. By virtue of such a structure in which the sealing sheet is stacked on the thickness-adjusting sheet, the liquid rubber composition can be prevented from leaking from the through-hole of the first processing sheet to the thickness-adjusting sheet during the integration of the first processing sheet with the base. For example, in the case where the liquid rubber composition leaks from the through-hole of the first processing sheet to the thickness-adjusting sheet and is then cured, an unnecessary liquid rubber composition needs to be removed after the curing of the base. In the case of stacking the sealing sheet in the manner of embodiments of the invention, the process of removing the unnecessary liquid rubber composition can be eliminated, and the first processing sheet can be formed so as to have a planar region around the through-hole.

The first processing sheet or second processing sheet can be placed on a planar surface of the mold, and the adhesive surface can be formed so as to be flush with the conductive contact, the adhesive surface being provided in a region formed as a result of removing the thickness-adjusting sheet.

The adhesive surface can be easily formed so as to be flush with the conductive contact as a result of utilizing the planar mold in this manner.

The adhesive section can be formed by using an adhesive tape having a substrate and adhesive layers provided on the two surfaces of the substrate. Use of the adhesive tape for the adhesive section enables the adhesive section to be formed through an attachment step, and the adhesive section can be therefore easily formed as compared with a step that requires accurate control, such as an application step.

The thickness-adjusting sheet can be formed so as to have a thickness the same as that of the adhesive tape. By virtue of such a structure, the conductive contact of the conductive section can be formed so as to be flush with the adhesive surface of the adhesive section.

The following four types of anisotropic conductor-arranged sheets are provided.

The first anisotropic conductor-arranged sheet is provided, which includes the anisotropic conductor having any one of the above advantages and includes a film sheet on which a plurality of the anisotropic conductors are arranged.

In the first anisotropic conductor-arranged sheet, the adhesive section of the anisotropic conductor is attached to the film sheet, and the adhesive section can be therefore prevented from adhesion of dust, dirt, foreign substances, or the like. The adhesive force of the adhesive section can be accordingly prevented from being decreased resulting from the adhesion of foreign substances or the like. Consequently, the first anisotropic conductor-arranged sheet can exhibit high adhesive force to objects to be fixed and be less likely to cause misalignment with and removal from objects to be fixed.

The second anisotropic conductor-arranged sheet is provided, which includes the anisotropic conductor having any one of the above advantages and includes a film sheet on which a plurality of the anisotropic conductors are arranged. The film sheet has an inspection hole corresponding to the conductive section of the anisotropic conductor.

In addition to the advantages provided in the first anisotropic conductor-arranged sheet, a probe is inserted into the inspection hole and is brought into contact with the conductive section in the second anisotropic conductor-arranged sheet. The electric state of the conductive section can be therefore checked in a state in which the anisotropic conductor is attached to the film sheet, thereby being able to easily check the electric state of the conductive section.

The electric states can be simultaneously checked in a plurality of anisotropic conductors, thereby being able to enhance efficiency of checking the electric state.

The third anisotropic conductor-arranged sheet is provided, which includes the anisotropic conductor having any one of the above advantages and includes a film sheet on which a plurality of the anisotropic conductors are arranged. The anisotropic conductors are alternately arranged on the film sheet in longitudinal and lateral directions.

In the third anisotropic conductor-arranged sheet, one anisotropic conductor is less likely to contact with the other anisotropic conductors on the film sheet and can be removed from the film sheet such that the other anisotropic conductors are prevented from adhering to the anisotropic conductor to be removed. Furthermore, the anisotropic conductors can be attached to objects to be fixed with automatically assembling equipment by utilizing a gap between the anisotropic conductors.

The fourth anisotropic conductor-arranged sheet is provided, which includes the anisotropic conductor having any one of the above advantages and includes a film sheet on which a plurality of the anisotropic conductors are arranged. The anisotropic conductors are arranged on the film sheet such that the edge of one anisotropic conductor is spaced apart from the edges of the adjacent anisotropic conductors.

In the fourth anisotropic conductor-arranged sheet, one anisotropic conductor is less likely to contact with the other anisotropic conductors on the film sheet and can be removed from the film sheet such that the other anisotropic conductors are prevented from adhering to the anisotropic conductor to be removed.

Advantageous Effects of Invention

According to the anisotropic conductor of embodiments of the invention and method of producing the anisotropic conductor, the material of the adhesive section can be determined without the consideration for adhesive force to the base, and the adhesive section can be formed as a result of employing an adhesive material that exhibits high adhesive force to objects to be fixed. The anisotropic conductor which is less likely to cause misalignment with and removal from objects to be fixed can be therefore provided. Furthermore, the hardness of the intermediate sheet can make the base difficult to be deformed, so that the anisotropic conductor can be easily treated.

Moreover, the adhesive section is not formed during the curing of the base, and the adhesive section is therefore free from the effect of the curing conditions of the base. The adhesive force of the adhesive section can be accordingly prevented from being decreased resulting from the curing of the base.

According to the anisotropic conductor-arranged sheet of embodiments of the invention, the adhesive section can be therefore prevented from adhesion of dust, dirt, foreign substances, or the like. The adhesive force of the adhesive section can be accordingly prevented from being decreased resulting from the adhesion of foreign substances or the like. Consequently, the anisotropic conductor-arranged sheet can exhibit high adhesive force to objects to be fixed and be less likely to cause misalignment with and removal from objects to be fixed.

DESCRIPTION OF EMBODIMENTS

Embodiments of the invention will be hereinafter described further in detail with reference to the drawings. The same structures used in each embodiment are denoted by the same reference signs, and the same description is omitted. Description of the same materials, effects, and advantages is similarly omitted.

Figure 1:
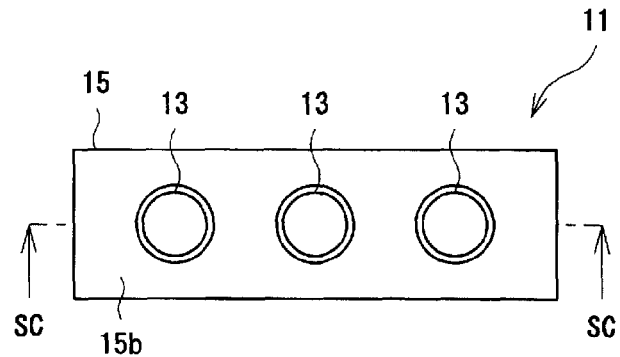
FIG. 1 is a plan view illustrating an anisotropic conductor of a first embodiment.
Figure 2:
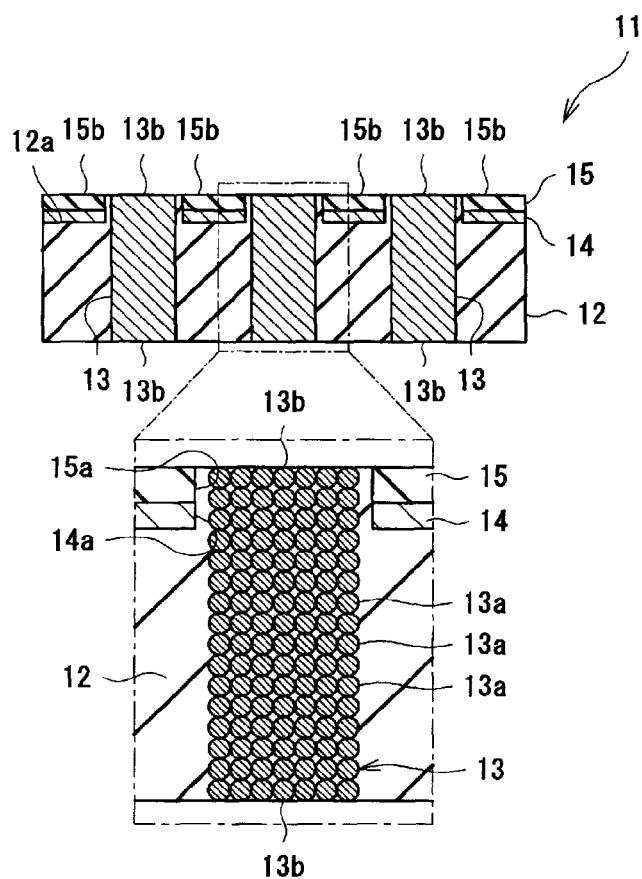
FIG. 2 is a vertical cross-sectional view illustrating the anisotropic conductor taken along the line SC-SC in FIG. 1.
Figure 16:
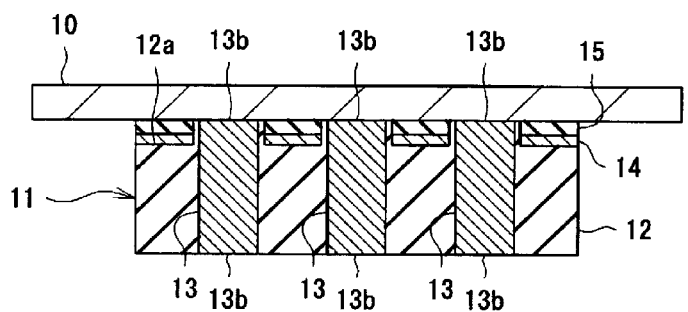
FIG. 16 illustrates a first anisotropic conductor-arranged sheet using the anisotropic conductor of the first embodiment.
Figure 17:
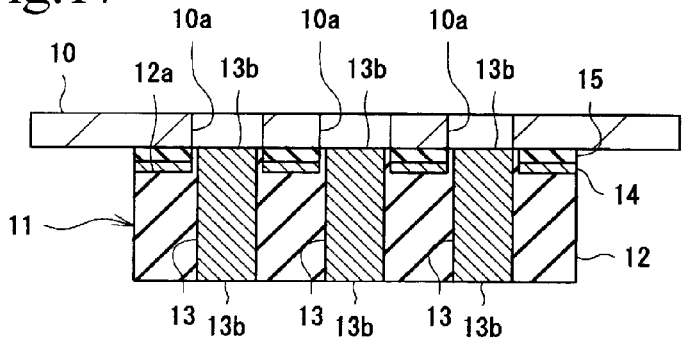
FIG. 17 illustrates a second anisotropic conductor-arranged sheet using the anisotropic conductor of the first embodiment.
Figure 18:
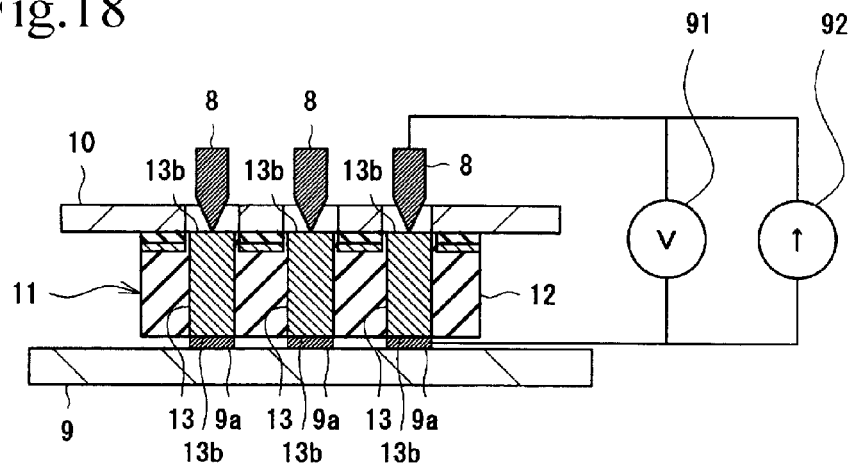
FIG. 18 illustrates check of an electric state in the second anisotropic conductor-arranged sheet using the anisotropic conductor of the first embodiment.
Figure 19:
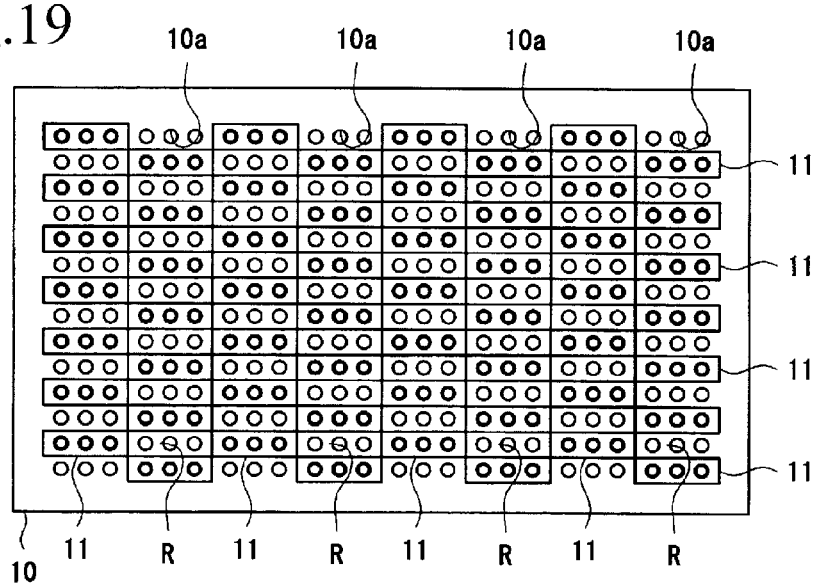
FIG. 19 illustrates a fourth anisotropic conductor-arranged sheet using the anisotropic conductor of the first embodiment.

First Embodiment [FIGS. 1 to 19]:

An anisotropic conductor 11 of a first embodiment, method of producing the anisotropic conductor 11, and an anisotropic conductor-arranged sheet are described with reference to FIGS. 1 to 19. FIG. 1 is a plan view illustrating the anisotropic conductor 11, FIG. 2 is a cross-sectional view illustrating the anisotropic conductor 11 taken along the line SC-SC, FIGS. 3 to 11 each illustrate a first method of producing the anisotropic conductor 11, FIGS. 12 to 15 each illustrate a second method of producing the anisotropic conductor 11, FIG. 16 illustrates a first anisotropic conductor-arranged sheet, FIG. 17 illustrates a second anisotropic conductor-arranged sheet, FIG. 18 illustrates check of an electric state in the second anisotropic conductor-arranged sheet, and FIG. 19 illustrates a third anisotropic conductor-arranged sheet. The anisotropic conductor 11 of this embodiment has a base 12, conductive sections 13, an intermediate sheet 14, and an adhesive section 15.

Configuration of Anisotropic Conductor 11; the base 12 is the main body of the anisotropic conductor 11 and serves as an insulating section which restricts the conductive sections 13 in a specific direction to impart anisotropy to the conductive sections 13. In this case, the base 12 is formed into a rectangular shape in plane view. The base 12 has three conductive sections 13 which penetrate the base 12 in the thickness direction and which will be hereinafter described in detail. The base 12 has surfaces in which the conductive sections 13 are exposed, and depression 12a is formed in one of such surfaces of the base 12 in a region other than a small area around each of the conductive sections 13. The intermediate sheet 14 and adhesive section 15, which will be each hereinafter described, are provided to the depression 12a.

The conductive sections 13 contribute to conductive connection, and a conductive material extends in the thickness direction of the base 12 to form the conductive sections 13 in a substantially cylindrical shape. The two ends of the individual conductive sections 13 are exposed from the base 12 to form conductive contacts 13b.

The intermediate sheet 14 is provided between the base 12 and the adhesive section 15 in order to enhance the adhesive force therebetween. The intermediate sheet 14 contacts with the adhesive section 15 and prevents the adhesive section 15 from contacting with the base 12. In particular, the intermediate sheet 14 is formed on the bottom of the depression 12a of the base 12, in which the adhesive section 15 is embedded. The intermediate sheet 14 has a film shape and has three through-holes 14a which the conductive sections 13 penetrate.

The adhesive section 15 contributes to enhancement of the adhesive force between the anisotropic conductor 11 and objects to be fixed and is provided to the conductive sections 13-exposed surface of the base 12. The adhesive section 15 is attached to the intermediate sheet 14 in the depression 12a of the base 12. An adhesive surface 15b is exposed from the base 12 and is formed so as to be flush with the conductive contacts 13b of the conductive sections 13.

Materials of Individual Sections; rubber elastic materials which have electrically insulating properties and exhibit rubber elasticity after being cured are used as the material of the base 12. Examples of such materials include silicone rubber, natural rubber, isoprene rubber, butadiene rubber, acrylonitrile-butadiene rubber, 1,2-polybutadiene rubber, styrene-butadiene rubber, chloroprene rubber, nitrile rubber, butyl rubber, ethylene-propylene rubber, chlorosulfone rubber, polyethylene rubber, acrylic rubber, epichlorohydrin rubber, fluororubber, urethane rubber, styrene-based thermoplastic elastomer, olefin-based thermoplastic elastomer, ester-based thermoplastic elastomer, urethane-based thermoplastic elastomer, amide-based thermoplastic elastomer, vinyl chloride-based thermoplastic elastomer, fluoride-based thermoplastic elastomer, and ion crosslinking thermoplastic elastomer. Among these, silicone rubber exhibits excellent moldability, electric insulating properties, and weather resistance and is therefore preferably employed. In the case where the conductive sections 13 are formed by utilizing magnetic field orientation as in the case of a production method which will be hereinafter described, a liquid polymer is further preferably employed. The liquid polymer needs to have a viscosity in which magnetic conductive particles 13a to be contained can exhibit fluidity in response to a magnetic field, and the viscosity is preferably in the range from 1 Pa·s to 250 Pa·s, and more preferably in the range from 10 Pa·s to 100 Pa·s.

Metallic or carbon materials having low electric resistance and preferably having a resistance value of 1Ω or lower are used as the material of the conductive sections 13. The conductive sections 13 of this embodiment may be configured such that the magnetic conductive particles 13a are continuously linked together in the rubber elastic material. Preferable examples of magnetic conductive materials include ferromagnetic metals such as iron, nickel, and cobalt; alloys containing such ferromagnetic metals; substances produced as a result of plating resin or ceramic with the ferromagnetic metals; and substances produced as a result of plating the powder of the ferromagnetic metals with good electrically conductive metal. Granular ferromagnetic metal can be used as the magnetic conductive particles 13a, thereby enabling magnetic field orientation in a liquid polymer. In the case of orienting the magnetic conductive particles 13a in the liquid polymer, a liquid rubber composition which contains the magnetic conductive particles 13a in an amount of 5 parts by weight to 100 parts by weight relative to the liquid polymer of 100 parts by weight are preferably employed. In the case where the magnetic conductive particles 13a is contained in an amount of less than 5 parts by weight, the magnetic conductive particles 13a are insufficiently linked together with the result that the magnetic conductive particles 13a do not penetrate the base 12 as the cured liquid polymer, and the conductive sections 13 may not be therefore formed. In the case where the magnetic conductive particles 13a is contained in an amount of greater than 100 parts by weight, the liquid rubber composition come to have excessively high viscosity, the orientation of the magnetic conductive particles 13a may fall into insufficiency.

The magnetic conductive particles 13a preferably have a spherical shape with a uniform diameter. Unless narrow particle distribution is exhibited, the conductive sections may branch or have uneven shapes. The particle distribution therefore preferably has a standard deviation of 20% or lower. The magnetic conductive particles 13a each have an average particle diameter that is in the range from 10 nm to 200 μm. In the case of an average particle diameter less than 10 nm, the liquid rubber composition come to have increased viscosity with the result that the magnetic conductive particles 13a are insufficiently linked together, and contact resistance in the conductive sections therefore increases. In the case of an average particle diameter larger than 200 μm, the magnetic conductive particles 13a easily precipitate in the liquid rubber composition, and then the dispersibility of the magnetic conductive particles 13a decreases with the result that the conductive sections 13 may not be uniformly formed.

In the case where the magnetic field orientation is not utilized for the formation of the conductive sections, good electrically conductive metallic materials other than the above described materials can be used. Examples of the materials to be used include metals such as gold, silver, platinum, aluminum, copper, palladium, and chromium; and alloys such as stainless steel and brass. Furthermore, a material which is produced as a result of plating a thin wire of resin or ceramic with a good electrically conductive metal can be used. The metallic material may be used in the form of a particle, fiber, or thin wire. Moreover, a metallic material formed into the shape of the conductive sections can be used.

The material of the adhesive section 15 depends on the type of objects to be fixed and can be selected from materials which can easily adhere to the objects to be fixed. Examples of such materials include a silicone-based resin, urethane-based resin, acrylic resin, epoxy-based resin, ethylene-vinyl-acetate copolymer, ethylene-acrylate copolymer, polyamide-based resin, polyester-based resin, polyolefin-based resin, fluorine-based resin, ionomer-based resin, polystyrene-based resin, polyimide-based resin, other thermoplastic resins and thermosetting resins, and an adhesive materials produced from a mixture of two or more of these materials. Furthermore, additives, such as a curing agent, vulcanizing agent, softening agent, colorant, and filler, may be added to these adhesive materials if needed. Moreover, such adhesive materials are applied onto the two sides of a substrate, such as a resin film or nonwoven cloth, to produce a both-sided tape, and the both-sided tape may be used.

A material used for the intermediate sheet 14 has hardness higher than that of the rubber elastic material and is less likely to deform resulting from the heat during the formation of the base 12. For instance, in the case of using silicone rubber or the like for the base 12, heat is applied at a temperature of 150° C. for approximately 90 seconds, and materials which are less likely to deform even under such conditions are used. In addition, materials having adhesiveness to the materials used for the base 12 are employed. Such materials can be selected from, for example, the following: metallic plates which are produced as a result of extending a metallic material such as iron or aluminum into a film; and resin films exhibiting high heat resistance. Preferable examples of the resin films exhibiting high heat resistance include a polyethylene terephthalate resin film; a polycarbonate resin film; and a resin film containing polyimide resin, polyarylate resin, polyarylsulfone resin, polyether sulfone resin, or polysulfone resin each exhibiting a deflection temperature under load of 170° C. or higher. A polyimide resin film is easily formed into a film and is therefore preferably used.

In this case, primer is applied to the surface which faces a liquid rubber composition 18, thereby being able to enhance the adhesive force between the intermediate sheet 14 and the base 12.

Method of Producing Anisotropic Conductor 11; two methods of producing the anisotropic conductor 11 will be described.

Figure 3:
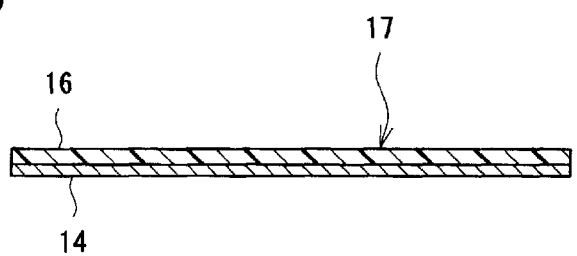
FIG. 3 illustrates a first processing sheet in a first method of producing the anisotropic conductor of the first embodiment.
Figure 4:
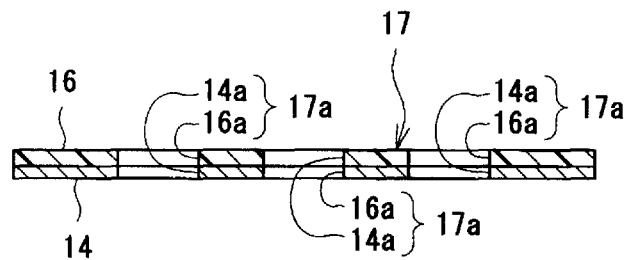
FIG. 4 illustrates through-holes of the first processing sheet in the first method of producing the anisotropic conductor of the first embodiment.

In the first production method, a thickness-adjusting sheet 16 is stacked on the intermediate sheet 14 as described in FIG. 3, thereby forming a first processing sheet 17. Through-holes 17a are formed in the first processing sheet 17 so as to penetrate the processing sheet 17 in the thickness direction as illustrated in FIG. 4. Through-holes 14a and 16a are respectively formed in the intermediate sheet 14 and thickness-adjusting sheet 16. The liquid rubber composition 18 in which a liquid polymer is mixed with the magnetic conductive particles 13a is separately prepared.

Figure 5:
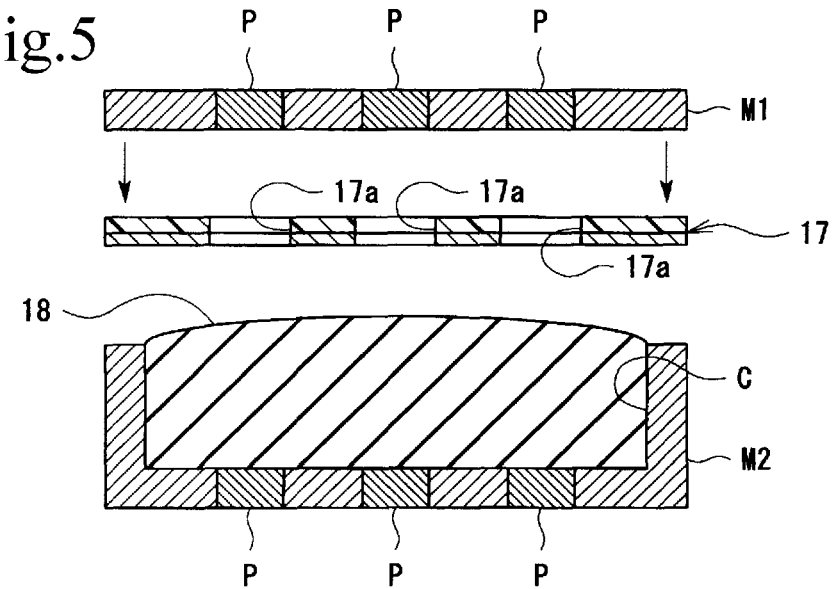
FIG. 5 illustrates a process in which a base-forming mold is closed in the first method of producing the anisotropic conductor of the first embodiment.
Figure 6:
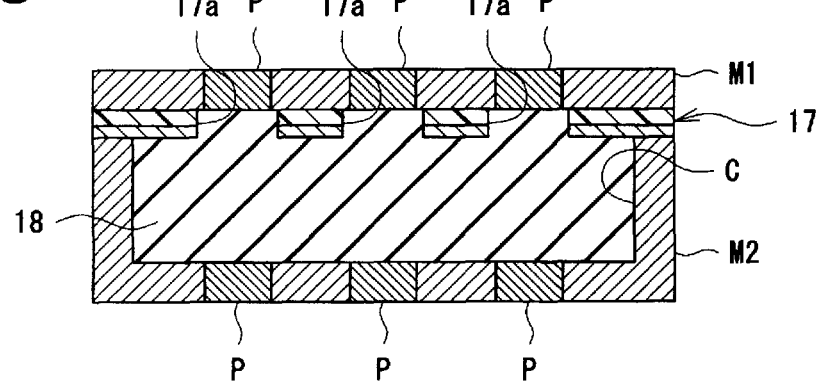
FIG. 6 illustrates the base-forming mold that has been closed in the first method of producing the anisotropic conductor of the first embodiment.
Figure 7:
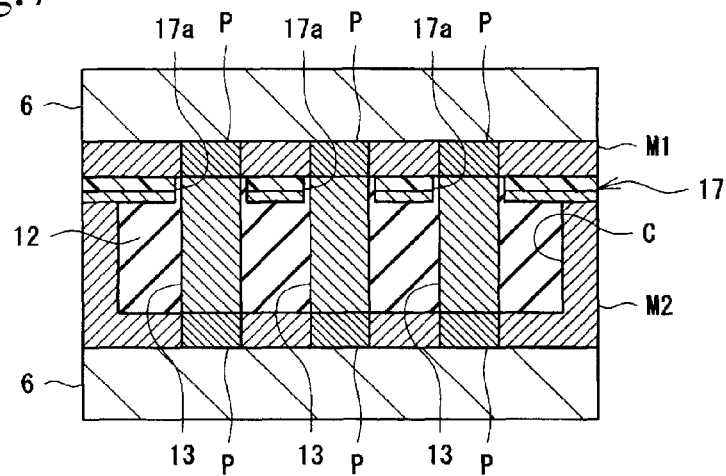
FIG. 7 illustrates application of a magnetic field to the base-forming mold in the first method of producing the anisotropic conductor of the first embodiment.

Then, a base-forming upper mold M1 and lower mold M2 are prepared, in which orientation pins P are embedded so as to positionally correspond to the conductive sections 13. As illustrated in FIG. 5, the liquid rubber composition 18 is put into the lower mold M2 having a cavity C. The through-holes 17a of the processing sheet 17 are aligned with the orientation pins P of the upper mold M1 while the intermediate sheet 14 of the processing sheet 17 faces the liquid rubber composition 18, and the lower mold M2 is subsequently closed with the upper mold M1. The liquid rubber composition 18 then enters the through-holes 17a of the first processing sheet 17 as illustrated in FIG. 6. Magnets 6 are subsequently set such that the base-forming upper mold M1 and lower mold M2 are interposed therebetween as illustrated in FIG. 7. A magnetic field is then applied to the inside of the cavity C to continuously orient the magnetic conductive particles 13a contained in the liquid rubber composition 18, thereby forming the conductive sections 13. In this state, heat is applied to the base-forming upper mold M1 and lower mold M2 to cure the liquid polymer contained in the liquid rubber composition 18, thereby integrating the base 12 with conductive sections 13 and first processing sheet 17. In this case, primer is applied to the liquid rubber composition 18-side surface of the intermediate sheet 14, thereby being able to enhance the adhesive force between the intermediate sheet 17 and the base 12.

Figure 8:
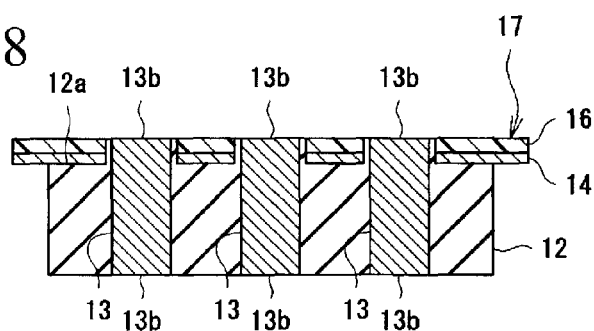
FIG. 8 illustrates a product demolded from the base-forming mold in the first method of producing the anisotropic conductor of the first embodiment.
Figure 9:
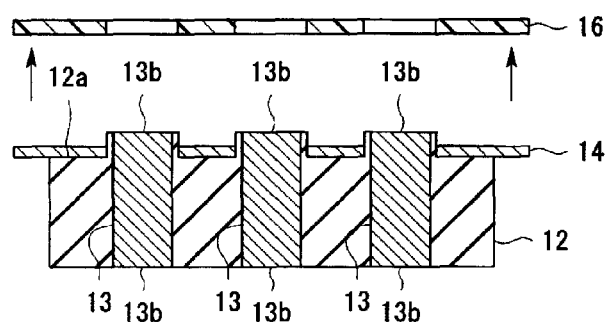
FIG. 9 illustrates a process in which a thickness-adjusting sheet is removed in the first method of producing the anisotropic conductor of the first embodiment.
Figure 10:
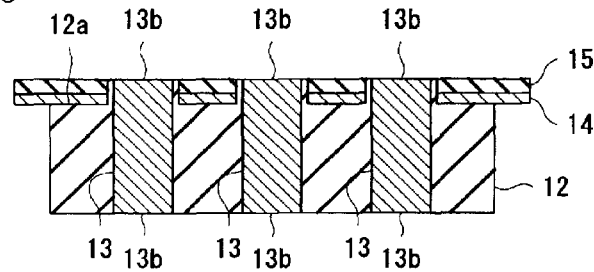
FIG. 10 illustrates an adhesive section that has been applied in the first method of producing the anisotropic conductor of the first embodiment.
Figure 11:
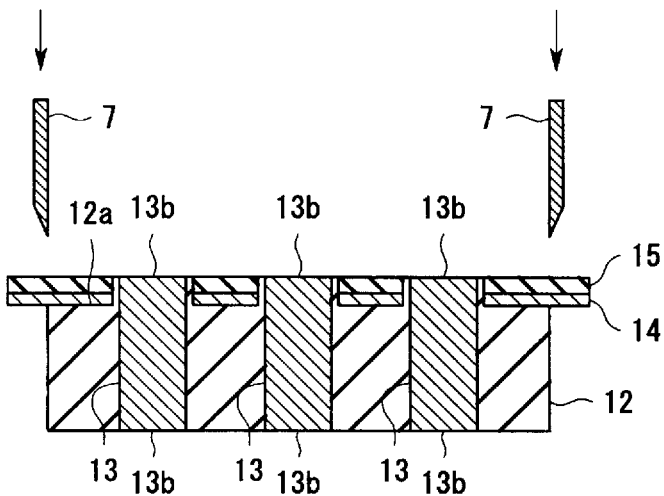
FIG. 11 illustrates a process in which unneeded portions are cut off in the first method of producing the anisotropic conductor of the first embodiment.

The base 12 is subsequently demolded as illustrated in FIG. 8. The thickness-adjusting sheet 16 of the first processing sheet 17 is removed from the intermediate sheet 14 as illustrated in FIG. 9, and an adhesive material is applied or transferred onto the intermediate sheet 14 in a thickness corresponding to that of the thickness-adjusting sheet 16, thereby forming the adhesive section 15 as illustrated in FIG. 10. The unneeded portions of the intermediate sheet 14 and adhesive section 15, which are protruding to the outside from the base 12, are finally removed with cutting blades 7 as illustrated in FIG. 11, thereby producing the anisotropic conductor 11.

The second production method will be hereinafter described.

The second production method is different from the first production method in use of a sealing sheet 19.

Figure 12:
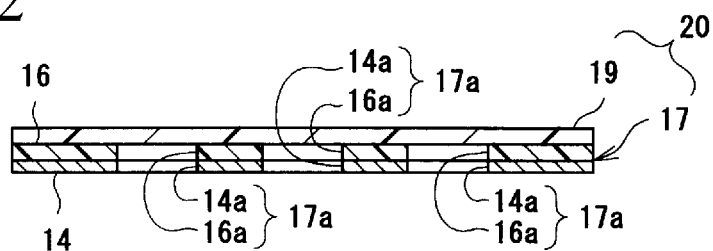
FIG. 12 illustrates a sealing sheet that has been stacked on the first processing sheet in a second method of producing the anisotropic conductor of the first embodiment.

In the second production method, the first processing sheet 17 having the through-holes 17a is formed as in the case of the first production method (see FIGS. 3 and 4), and the sealing sheet 19 is then stacked on the thickness-adjusting sheet 16 of the first processing sheet 17 as illustrated in FIG. 12, thereby forming a second processing sheet 20. The liquid rubber composition 18 in which a liquid polymer is mixed with the magnetic conductive particles 13a is separately prepared as in the case of the first production method.

Figure 13:
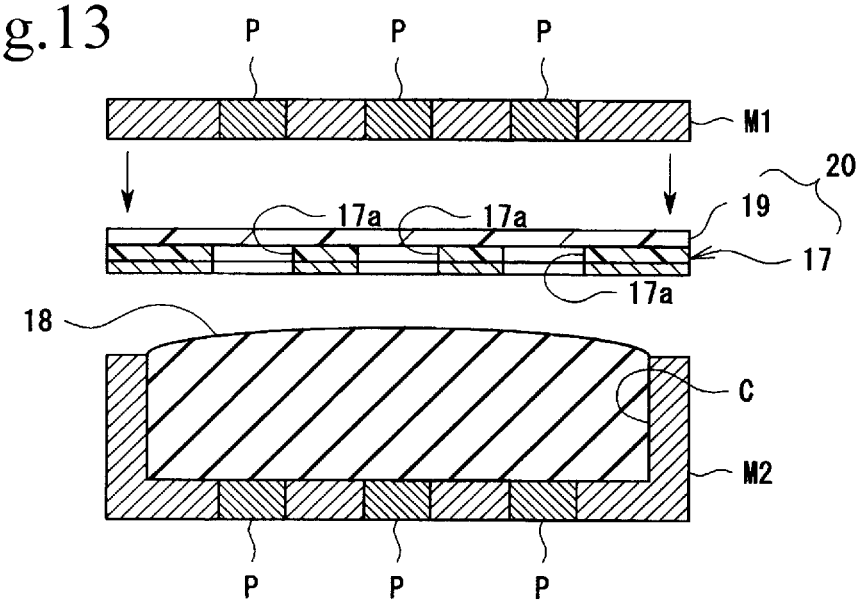
FIG. 13 illustrates a process in which a base-forming mold is closed in the second method of producing the anisotropic conductor of the first embodiment.
Figure 14:
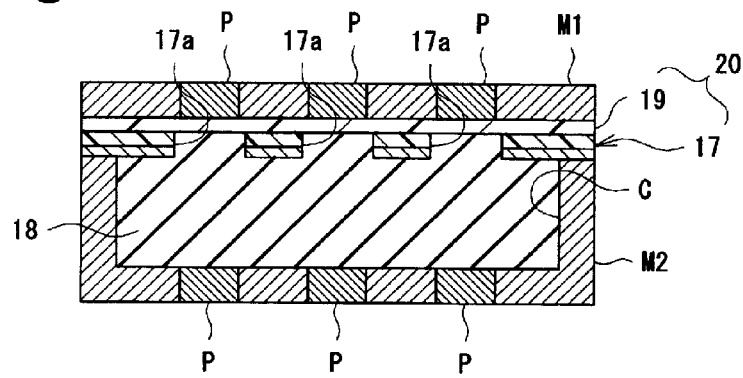
FIG. 14 illustrates a base-forming mold that has been closed in the second method of producing the anisotropic conductor of the first embodiment.

Then, the base-forming upper mold M1 and lower mold M2, in which the orientation pins P are embedded, are prepared as in the case of the first production method. As illustrated in FIG. 13, the liquid rubber composition 18 is put into the lower mold M2 having a cavity C. The through-holes 17a of the first processing sheet 17 are aligned with the orientation pins P of the upper mold M1 while the intermediate sheet 14 of the second processing sheet 20 faces the liquid rubber composition 18, and the lower mold M2 is subsequently closed with the upper mold M1. The liquid rubber composition 18 then enters the through-holes 17a of the first processing sheet 17 as illustrated in FIG. 14. The magnets 6 are subsequently set such that the upper mold M1 and lower mold M2 are interposed therebetween. A magnetic field is then applied to the inside of the cavity C to form the conductive sections 13. In this state, heat is applied to the upper mold M1 and lower mold M2 to integrate the base 12 with the conductive sections 13 and second processing sheet 20 with each other (see FIG. 7).

Figure 15:
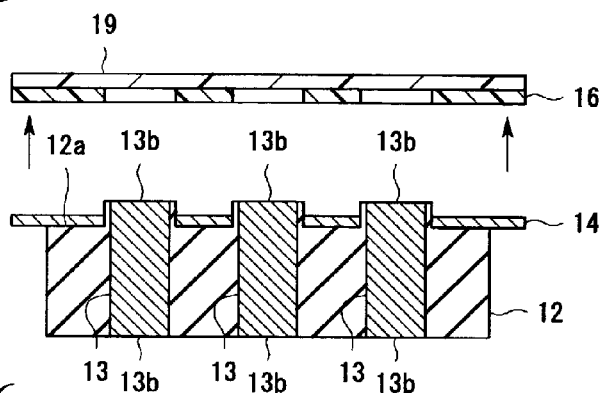
FIG. 15 illustrates a process in which the sealing sheet and thickness-adjusting sheet are removed in the second method of producing the anisotropic conductor of the first embodiment.

The base 12 is subsequently demolded, and the sealing sheet 19 and the thickness-adjusting sheet 16 of the first processing sheet 17 are removed from the intermediate sheet 14 as illustrated in FIG. 15. An adhesive material is applied onto the intermediate sheet 14 in a thickness corresponding to that of the thickness-adjusting sheet 16, thereby forming the adhesive section 15 (see FIG. 10). The unneeded portions of the intermediate sheet 14 and adhesive section 15 are finally removed with the cutting blades 7 as in the case of the first production method (see FIG. 11), thereby producing the anisotropic conductor 11.

The members used in the method of producing the anisotropic conductor 11 will be hereinafter described.

Nonmagnetic metals such as an aluminum alloy and austenitic stainless steel are used as a material of the base-forming upper mold M1 and lower mold M2. Among these, the aluminum alloy is preferably used in terms of mold workability.

Magnetic metals such as iron, stainless steel, cobalt, and nickel are used as a material of the orientation pins P. Among these, stainless steel is preferably used in terms of workability.

Examples of a material used for the thickness-adjusting sheet 16 and sealing sheet 19 include a polyethylene terephthalate resin film, a polycarbonate resin film, and nonwoven cloth. These materials are used as a substrate, and an adhesive layer (not illustrated) is formed on one surface of the substrate, thereby forming a structure of a one-sided adhesive sheet.

Anisotropic Conductor-arranged Sheet; placing the anisotropic conductor 11 on a film sheet 10 enables a plurality of anisotropic conductors 11 to be handled all together. Some types of anisotropic conductor-arranged sheet will be hereinafter described.

In a first anisotropic conductor-arranged sheet, the adhesive sections 15 of the anisotropic conductors 11 are attached to the film sheet 10 as illustrated in FIG. 16.

FIG. 17 illustrates a second anisotropic conductor-arranged sheet. The second anisotropic conductor-arranged sheet is different from the first anisotropic conductor-arranged sheet in that the film sheet 10 has inspection holes 10a which penetrate the film sheet 10 in the thickness direction. The adhesive sections 15 of the anisotropic conductors 11 are attached to the film sheet 10 while the conductive sections 13 of the anisotropic conductors 11 are aligned with the inspection holes 10a of the film sheet 10.

In a third anisotropic conductor-arranged sheet, as illustrated in FIG. 19, the adhesive sections 15 of the anisotropic conductors 11 are attached to the film sheet 10 such that the anisotropic conductors 11 are alternately arranged on the film sheet 10 in longitudinal and lateral directions in plane view.

Advantages; since the anisotropic conductor 11 has the intermediate sheet 14 which are positioned between the base 12 and adhesive section 15 and which adheres to the base 12, the material of the adhesive section 15 can be determined without the consideration for adhesive force to the base 12 in the case of fixing the anisotropic conductor 11 to objects to be fixed, such as circuit boards and metallic cases. An adhesive material that exhibits high adhesive force to the objects to be fixed can be therefore employed to form the adhesive section 15. The anisotropic conductor 11 which is less likely to cause misalignment with and removal from the objects to be fixed can be accordingly provided. Furthermore, since the intermediate sheet 14 is attached to the base 12, the hardness of the intermediate sheet 14 can make the base 12 difficult to deform, so that the anisotropic conductor 11 can be easily treated.

Since the intermediate sheet 14 is formed by using a heat-resistant curing resin which exhibits a deflection temperature under load of 170° C. or higher, the intermediate sheet 14 can be prevented from thermally deforming during the thermal curing of the base 12. The anisotropic conductor 11 can be therefore provided so as to have high dimensional accuracy without the occurrence of deformation, such as flexure and deflection.

Since the conductive contacts 13b of the conductive sections 13 are formed so as to be flush with the adhesive surface 15b of the adhesive section 15, the surface of the anisotropic conductor 11 can uniformly contact with the surfaces of objects to be fixed without formation of gaps. The conductive contacts 13b can therefore serve to stably secure conductive connection, and the adhesive surface 15b enables excellent adhesive force to be provided.

In the method of producing the anisotropic conductor 11, the thickness-adjusting sheet 16 is removed, and the adhesive section 15 is formed in a region formed by the removal. The adhesive section 15 can be therefore formed so as to have the structure substantially the same as that of the thickness-adjusting sheet 16, and the adhesive section 15 can be accordingly attached to the intermediate sheet 14. In the adhesive section 15 of the anisotropic conductor 11 produced in this manner, the material of the adhesive section 15 can be determined without the consideration for adhesive force to the base 12 in the case of fixing the anisotropic conductor 11 to the base 12. An adhesive material that exhibits high adhesive force to objects to be fixed can be therefore employed to form the adhesive section 15. The anisotropic conductor 11 which is less likely to cause misalignment with and removal from the objects to be fixed can be accordingly provided.

Furthermore, for the reason that the thickness-adjusting sheet 16 is removed after the integration of the first processing sheet 17, base 12, with conductive sections 13 and that the adhesive section 15 is subsequently formed, the adhesive section 15 is not formed during the thermal curing of the base 12, and the adhesive section 15 is therefore free from the effect of the heat of the base 12. The adhesive force of the adhesive section 15 can be accordingly prevented from being decreased resulting from the thermal curing of the base 12.

Moreover, since the thickness-adjusting sheet 16 is removed after the integration of the first processing sheet 17, base 12, with conductive sections 13, the conductive sections 13 can protrude from the intermediate sheet 14 after the removal of the thickness-adjusting sheet 16. Accordingly, the adhesive section 15 is formed so as to have a thickness the same as that of the thickness-adjusting sheet 16, so that the conductive contacts 13b of the conductive sections 13 are formed so as to be flush with the adhesive surface 15b of the adhesive section 15.

In the production method of this embodiment, the through-holes 17a of the first processing sheet 17 are filled with the liquid rubber composition 18, and the conductive sections 13 are then formed by utilizing magnetic field orientation. The conductive sections 13 can be therefore formed at the positions corresponding to the through-holes 17a of the first processing sheet 17, so that the conductive sections 13 which penetrate the through-holes 17a of the first processing sheet 17 can be easily formed.

Since an adhesive material is applied or transferred to form the adhesive section 15 in the process of forming the adhesive section 15, the adhesive section 15 can be easily formed in place of the thickness-adjusting sheet 16.

Especially in the second production method, because the sealing sheet 19 is stacked on the thickness-adjusting sheet 16, the liquid rubber composition 18 is prevented from leaking from the through-holes 17a of the first processing sheet 17 to the thickness-adjusting sheet 16 during the integration of the second processing sheet 20 with the base 12.

In the first anisotropic conductor-arranged sheet, the adhesive section 15 of the anisotropic conductor 11 is attached onto the film sheet 10, and the adhesive section 15 can be therefore prevented from adhesion of dust, dirt, foreign substances, or the like. The adhesive force of the adhesive section 15 can be accordingly prevented from being decreased resulting from the adhesion of foreign substances or the like. Consequently, the anisotropic conductor 11 can be provided, which can exhibit high adhesive force to objects to be fixed and which is less likely to cause misalignment with and removal from objects to be fixed.

In the second anisotropic conductor-arranged sheet, in addition to the advantages provided in the first anisotropic conductor-arranged sheet, probes 8 are inserted into the inspection holes 10a as illustrated FIG. 18 to be brought into contact with the conductive contacts 13b at one ends of the conductive sections 13, and the conductive contacts 13b at the other ends of the conductive sections 13 are brought into contact with electrodes 9a on the detection substrate 9. Then, the electric state of the conductive sections 13 can be checked in a state in which the anisotropic conductor is adhering to the film sheet 10. The electric state of the conductive sections 13 can be therefore easily checked.

In the case where a plurality of anisotropic conductors 11 are attached to the film sheet 10, the electric states of the plurality of anisotropic conductor 11 can be simultaneously checked, thereby being able to enhance efficiency in checking the electric state. In FIG. 18, the symbol "V" represents a voltmeter 91, and the symbol "↑" represents a constant-current power source 92.

In the third anisotropic conductor-arranged sheet, one anisotropic conductor 11 is less likely to contact with the other anisotropic conductors 11 on the film sheet 10 and can be removed from the film sheet 10 such that the other anisotropic conductors 10 are prevented from adhering to the anisotropic conductor 11 to be removed. Furthermore, the anisotropic conductors 11 can be adhesively attached to objects to be fixed with automatically assembling equipment by utilizing a gap R which has a size the same as those of the anisotropic conductors 11.

Figure 20:
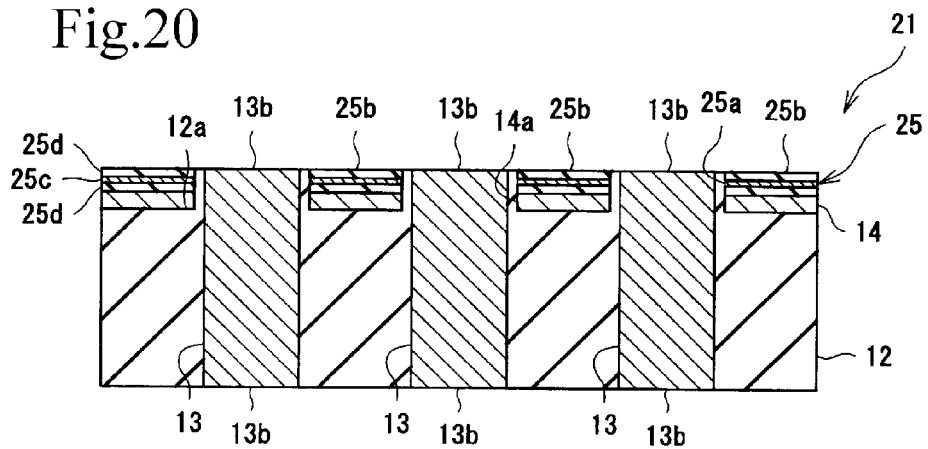
FIG. 20 is a cross-sectional view illustrating an anisotropic conductor of a second embodiment in the same manner as FIG. 2.
Figure 21:
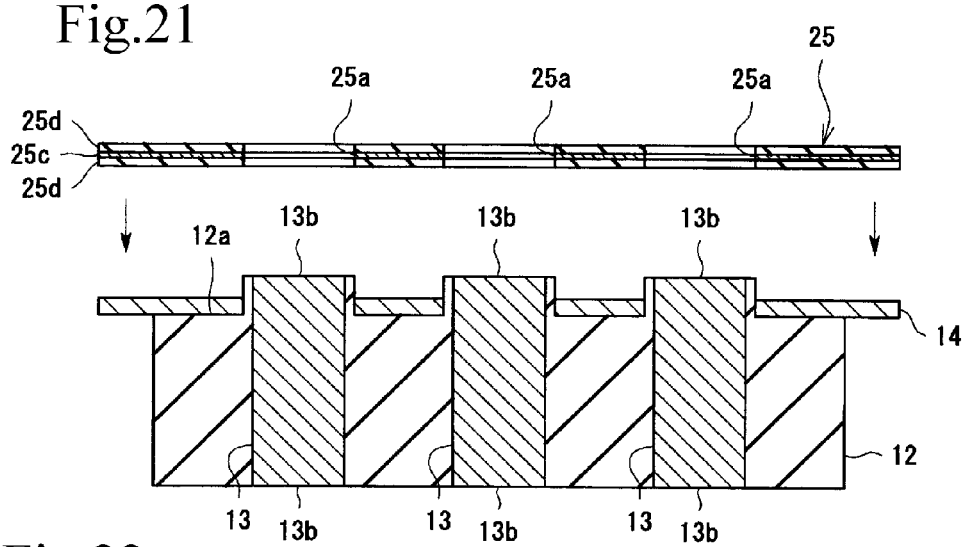
FIG. 21 illustrates a process in which an adhesive tape is attached in the method of producing the anisotropic conductor of the second embodiment.
Figure 22:
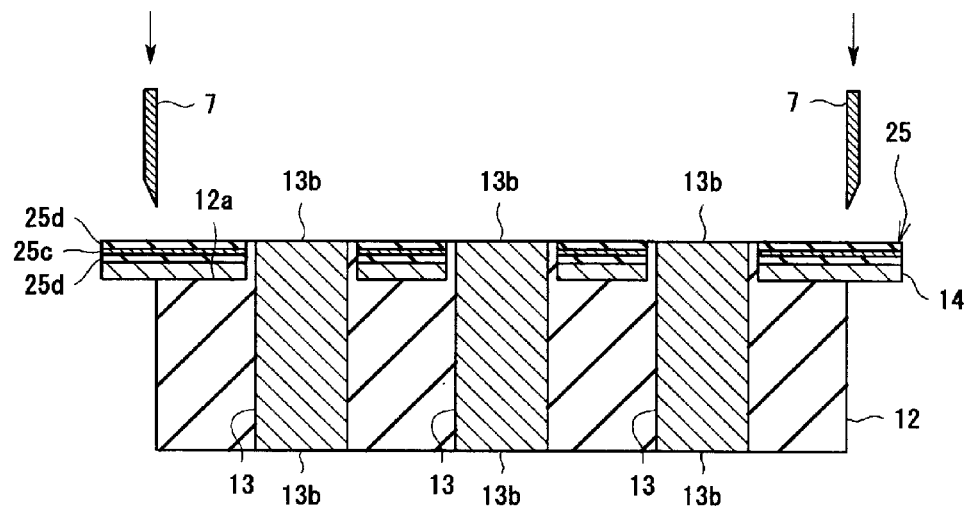
FIG. 22 illustrates a process in which unneeded sections are cut off in the method of producing the anisotropic conductor of the second embodiment.

Second Embodiment [FIGS. 20 to 22]:

An anisotropic conductor 21 of this embodiment and a method of producing the anisotropic conductor 21 will be described with reference to FIGS. 20 to 22. FIG. 20 is a vertical cross-sectional view illustrating the anisotropic conductor 21, and FIGS. 21 and 22 each illustrate the method of producing the anisotropic conductor 21. An adhesive section 25 of the anisotropic conductor 21 of this embodiment is different from the adhesive section 15 of the anisotropic conductor 11 in that a so-called both-sided tape is used.

Configuration of Anisotropic Conductor 21; the adhesive section 25 differs from the adhesive section 15 as a coating layer and is provided in the form of a single sheet in which adhesive layers 25d are formed on the two sides of a substrate 25c. The adhesive section 25 is formed so as to have a rectangular shape with a size the same as that of one of the conductive sections 13-exposed surfaces of the base 12 and has three through-holes 25a which the conductive sections 13 penetrate. The adhesive section 25 is attached to the intermediate sheet 14 in the depression 12a of the base 12, and an adhesive surface 25b, which does not face the base 12, is flush with the conductive contacts 13b of the conductive section 13.

Method of Producing Anisotropic Conductor 21; a method of producing the anisotropic conductor 21 will be described.

As in the case of the second production method of the anisotropic conductor 11, the first processing sheet 17 having the through-holes 17a is formed (see FIGS. 3 and 4), and the sealing sheet 19 is then stacked on the thickness-adjusting sheet 16 of the first processing sheet 17, thereby forming a second processing sheet 20 (see FIG. 12). The liquid rubber composition 18 in which a liquid polymer is mixed with the magnetic conductive particles 13a is separately prepared as in the case of the first production method.

Then, the base-forming upper mold M1 and lower mold M2, in which the orientation pins P are embedded at positions corresponding to the conductive sections 13, are prepared. The liquid rubber composition 18 is put into the lower mold M2 having a cavity C. The through-holes 17a of the first processing sheet 17 are aligned with the orientation pins P of the upper mold M1 while the intermediate sheet 14 of the second processing sheet 20 faces the liquid rubber composition 18, and the lower mold M2 is subsequently closed with the upper mold M1 (see FIG. 13). The liquid rubber composition 18 then enters the through-holes 17a of the first processing sheet 17 (see FIG. 14). The magnets 6 are subsequently set such that the upper mold M1 and lower mold M2 are interposed therebetween. A magnetic field is then applied to the inside of the cavity C to form the conductive sections 13. In this state, heat is applied to the upper mold M1 and lower mold M2 to integrate the base 12 with the conductive sections 13 and second processing sheet 20 (see FIG. 7).

The base 12 is subsequently demolded, and the sealing sheet 19 and the thickness-adjusting sheet 16 of the first processing sheet 17 are removed from the intermediate sheet 14 (see FIG. 15). As illustrated in FIG. 21, the through-holes 25a are formed in the adhesive tape 25 having a thickness corresponding to that of the thickness-adjusting sheet 16, and the adhesive tape 25 is attached to the intermediate sheet 14. The unneeded portions of the intermediate sheet 14 and adhesive tape 25 are finally removed with the cutting blades 7 as illustrated in FIG. 22, thereby producing the anisotropic conductor 21.

Advantages; in the anisotropic conductor 21, since an "adhesive tape" is used to form the adhesive section 25, the hardness, which is brought by the "adhesive tape", of the substrate 25c enables the base 12 to be less likely to deform, so that the anisotropic conductor 21 can be easily treated.

The adhesive tape 25 has the through-holes 25a so as to positionally correspond to the conductive sections 13, and the adhesive tape 25 does not therefore interfere with the conductive sections 13 and interrupt the conductive connection of the conductive sections 13, thereby being able to provide the anisotropic conductor 21 which can stably secure conductive connection.

The adhesive tape 25 is used in place of the thickness-adjusting sheet 16 in the method of producing the anisotropic conductor 21, and adhesive section 25 can be therefore formed through an attachment step, thereby being able to easily form the adhesive section 25 as compared with a case that requires accurate control, such as an application process.

Since the thickness-adjusting sheet 16 has the thickness the same as that of the adhesive tape 25 in the production method of this embodiment, the conductive contacts 13b of the conductive sections 13 can be formed so as to be flush with the adhesive surface 25b of the adhesive tape 25.

Figure 23:
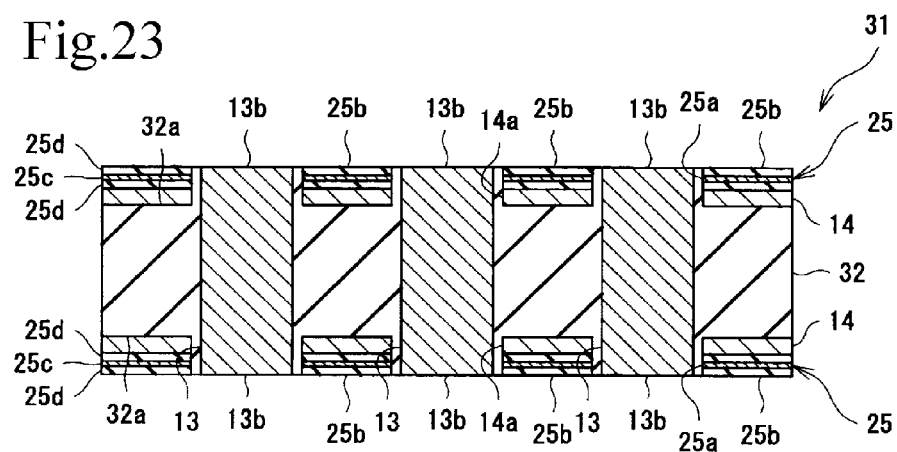
FIG. 23 is a cross-sectional view illustrating an anisotropic conductor of a third embodiment in the same manner as FIG. 2.

Third Embodiment [FIGS. 23 to 27]:

An anisotropic conductor 31 of this embodiment and a method of producing the anisotropic conductor 31 will be described with reference to FIGS. 23 to 27. FIG. 23 is a vertical cross-sectional view illustrating the anisotropic conductor 31, and FIGS. 24 to 27 each illustrate the method of producing the anisotropic conductor 31. The anisotropic conductor 31 of this embodiment differs from the anisotropic conductor 21 of the second embodiment in that the adhesive sections 25 (adhesive tape) are provided on the two sides of a base 32.

Configuration of Anisotropic Conductor 31; the base 32 is formed so as to have a rectangular shape in plane view and has the three conductive sections 13 which penetrate the base 32 in the thickness direction. The base 32 is different from the base 12 of the anisotropic conductor 21 in that depressions 32a are individually formed in the conductive sections 13-exposed two surfaces of the base 32 in regions other than small areas around each of the conductive sections 13. The intermediate sheet 14 and adhesive tape 25 are provided in each of the depressions 32a, and the exposed adhesive tapes 25 form the adhesive surfaces 25b.

Method of Producing Anisotropic Conductor 31; the method of producing the anisotropic conductor 31 will be described.

As in the case of the method of producing the anisotropic conductor 21, the first processing sheets 17 having the through-holes 17a are formed (see FIGS. 3 and 4), and the sealing sheets 19 are then stacked on the thickness-adjusting sheets 16 of the first processing sheets 17, thereby forming the second processing sheets 20 (see FIG. 12). The liquid rubber composition 18 in which a liquid polymer is mixed with the magnetic conductive particles 13a is separately prepared as in the case of the first production method.

Figure 24:
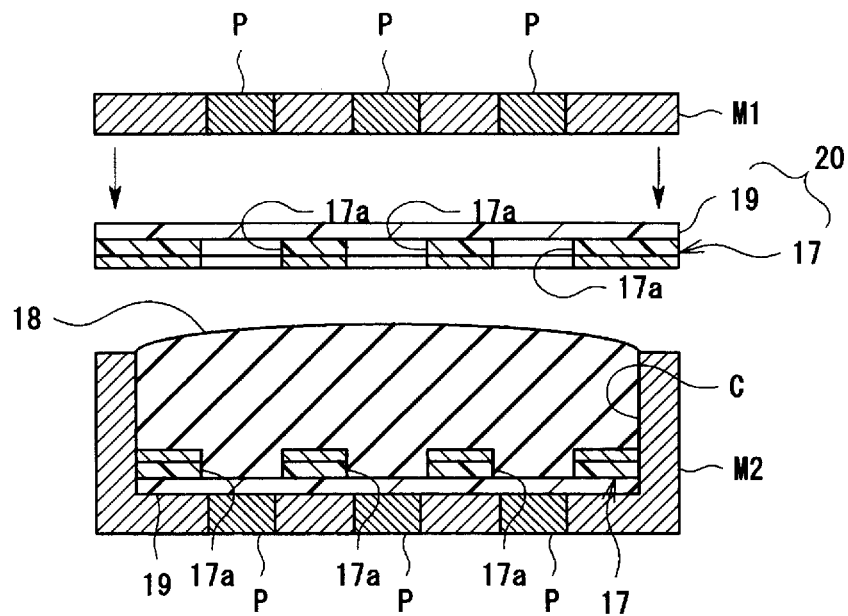
FIG. 24 illustrates a process in which the base-forming mold is closed in a method of producing the anisotropic conductor of the third embodiment.

Then, the base-forming upper mold M1 and lower mold M2, in which the orientation pins P are embedded at positions corresponding to the conductive sections 13, are prepared. As illustrated in FIG. 24, one second processing sheet 20 is inserted into the lower mold M2 having the cavity C such that the sealing sheet 19 contacts with the mold surface, and the liquid rubber composition 18 is subsequently put thereinto. Then, the other second processing sheet 20 is set such that the intermediate sheet 14 faces the liquid rubber composition 18, and the through-holes 17a of the first processing sheet 17 are aligned with the orientation pins P of the upper mold M1. The lower mold M2 is subsequently closed with the upper mold M1. The liquid rubber composition 18 then enters the through-holes 17a of the first processing sheets 17 (see FIG. 14). The magnets 6 are subsequently set such that the upper mold M1 and lower mold M2 are interposed therebetween. A magnetic field is then applied to the inside of the cavity C to form the conductive sections 13. In this state, heat is applied to the upper mold M1 and lower mold M2 to integrate the base 12 with the conductive sections 13 and second processing sheets 20 (see FIG. 7).

Figure 25:
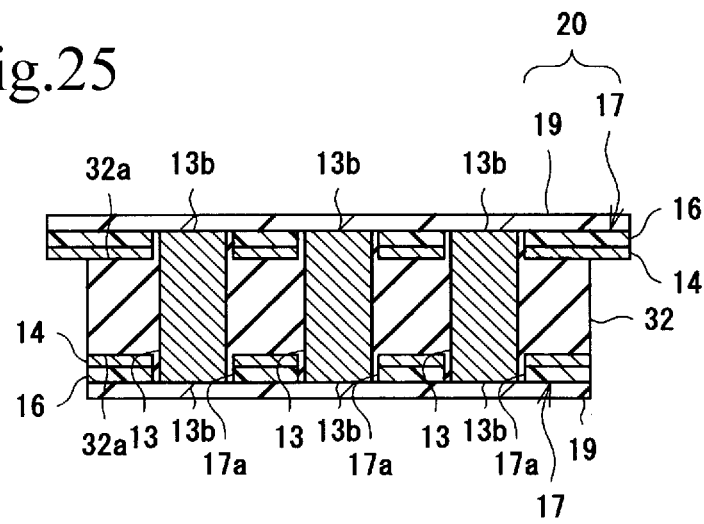
FIG. 25 illustrates a product demolded from the base-forming mold in the method of producing the anisotropic conductor of the third embodiment.
Figure 26:
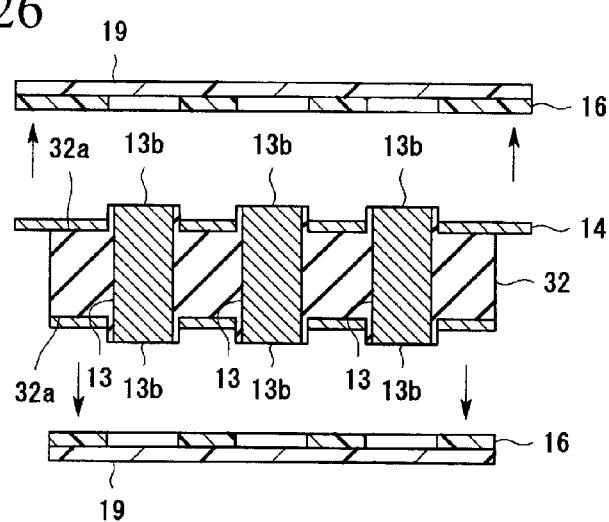
FIG. 26 illustrates a process in which the sealing sheet and thickness-adjusting sheet are removed in the method of producing the anisotropic conductor of the third embodiment.
Figure 27:
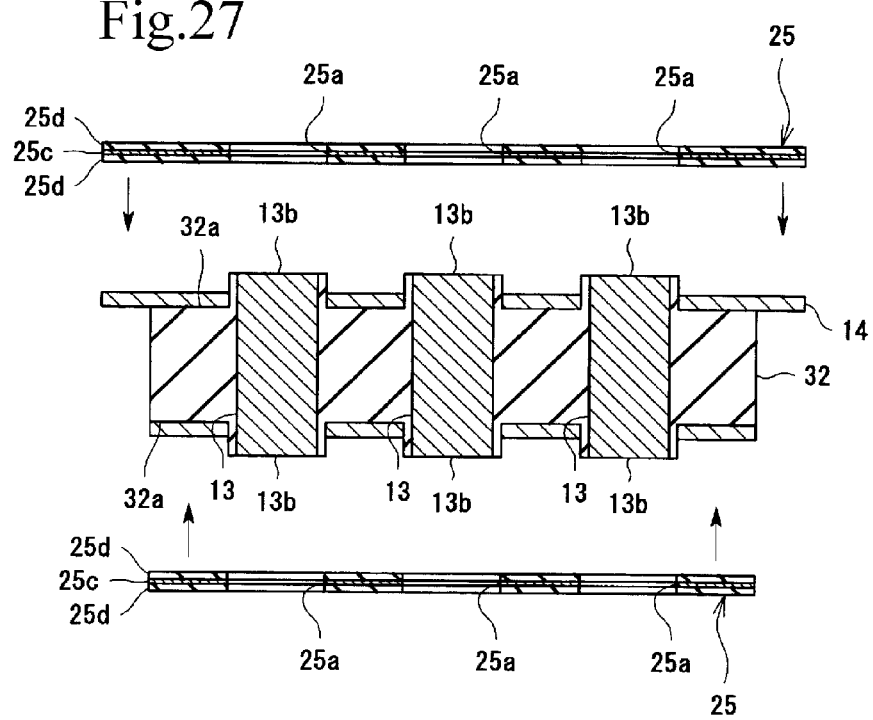
FIG. 27 illustrates a process in which an adhesive tape is attached in the method of producing the anisotropic conductor of the third embodiment.

The base 32 is subsequently demolded as illustrated in FIG. 25, and the sealing sheets 19 and the thickness-adjusting sheets 16 of the first processing sheets 17 are then removed from the intermediate sheets 14 as illustrated in FIG. 26. As illustrated in FIG. 27, the adhesive tapes 25 are prepared so as to have a thickness corresponding to those of the thickness-adjusting sheets 16 and so as to have the through-holes 25a, and the adhesive tapes 25 are attached to the intermediate sheets 14. The unneeded portions of the intermediate sheet 14 and adhesive tape 25 are finally removed with the cutting blades 7 (see FIG. 22), thereby producing the anisotropic conductor 31.

Advantages; By virtue of the anisotropic conductor 31 and the method of producing the anisotropic conductor 31, the adhesive tapes 25 are provided on the two surfaces having the conductive contacts 13b, and the anisotropic conductor 31 which is less likely to cause misalignment with and removal from electrically connected two objects to be fixed can be therefore provided.

Figure 28:
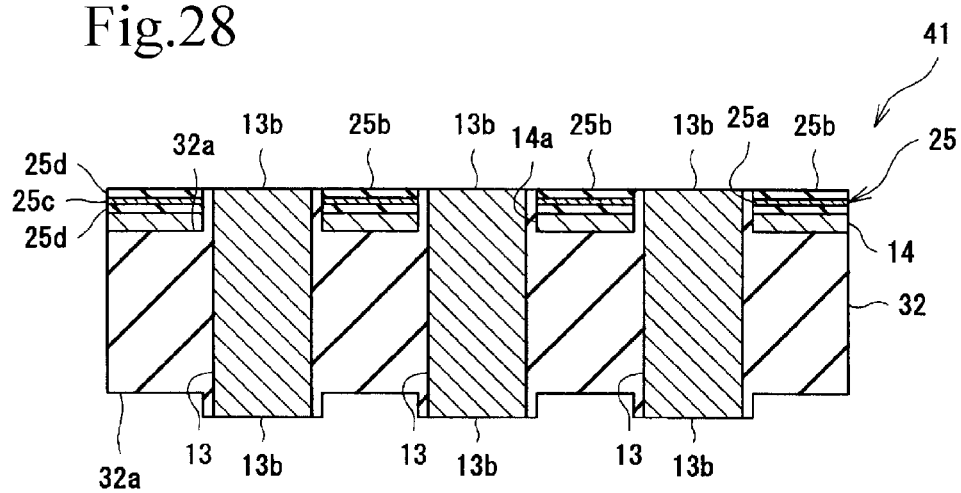
FIG. 28 is a cross-sectional view illustrating an anisotropic conductor of a fourth embodiment in the same manner as FIG. 2.
Figure 29:
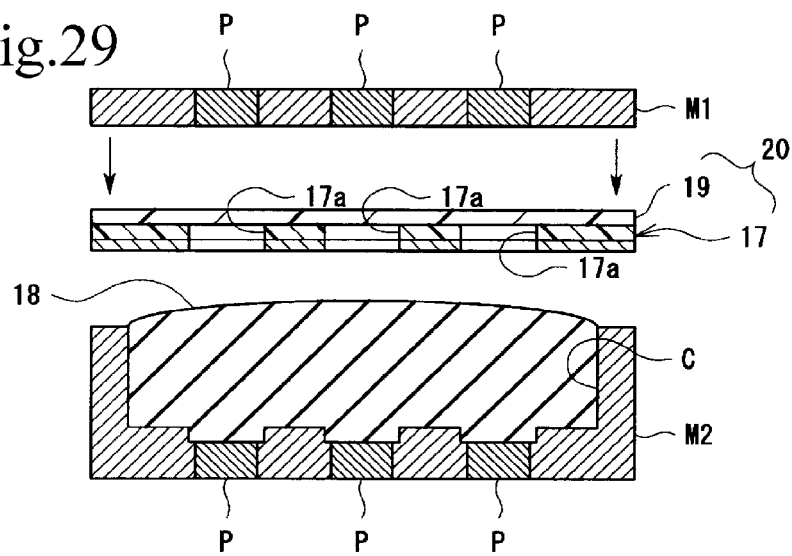
FIG. 29 illustrates a process in which the base-forming mold is closed in a method of producing the anisotropic conductor of the fourth embodiment.

Fourth Embodiment [FIGS. 28 and 29]:

An anisotropic conductor 41 of this embodiment and a method of producing the anisotropic conductor 41 will be described with reference to FIGS. 28 and 29.

FIG. 28 is a vertical cross-sectional view illustrating the anisotropic conductor 41, and FIG. 29 illustrates the method of producing the anisotropic conductor 41. Although the anisotropic conductor 41 of this embodiment includes the depressions 32a which are formed in the two surfaces of the base 32 as in the case of the anisotropic conductor 31 of the third embodiment, the anisotropic conductor 41 differs in that the adhesive section 25 is provided on one surface of the base 32.

Configuration of Anisotropic Conductor 41; the depressions 32a are individually formed in the conductive sections 13-exposed two surfaces of the base 32 in regions other than small areas around each of the conductive sections 13. The intermediate sheet 14 and adhesive tape 25 are provided in the depression 32a formed in one surface of the base 32, and the exposed adhesive tape 25 forms the adhesive surface 25b. In the other surface of the base 32, the conductive contacts 13 are protruding.

Method of Producing Anisotropic Conductor 41; as in the case of the method of producing the anisotropic conductor 31, the first processing sheet 17 having the through-holes 17a is formed (see FIGS. 3 and 4), and the sealing sheet 19 is then stacked on the thickness-adjusting sheet 16 of the first processing sheet 17, thereby forming a second processing sheet 20 (see FIG. 12). The liquid rubber composition 18 in which a liquid polymer is mixed with the magnetic conductive particles 13a is separately prepared as in the case of the first production method.

Then, the base-forming upper mold M1 and lower mold M2, in which the orientation pins P are embedded at positions corresponding to the conductive sections 13, are prepared. In the lower mold M2 of this embodiment, the bottom of the cavity C is protruding to the inside of the cavity C such that non-protruding areas are slightly left around each of the orientation pins P. As illustrated in FIG. 29, the liquid rubber composition 18 is subsequently put into the lower mold M2. Then, the second processing sheet 20 is set such that the intermediate sheet 14 faces the liquid rubber composition 18, and the through-holes 17a of the first processing sheet 17 are aligned with the orientation pins P of the upper mold M1. The lower mold M2 is subsequently closed with the upper mold M1. The liquid rubber composition 18 then enters the through-holes 17a of the first processing sheet 17 (see FIG. 14). The magnets 6 are subsequently set such that the upper mold M1 and lower mold M2 are interposed therebetween. A magnetic field is then applied to the inside of the cavity C to form the conductive sections 13. In this state, heat is applied to the upper mold M1 and lower mold M2 to integrate the base 12 with the conductive sections 13 and second processing sheet 20 (see FIG. 7).

The base 32 is subsequently demolded, and the sealing sheet 19 and the thickness-adjusting sheet 16 of the first processing sheet 17 are then removed from the intermediate sheet 14 (see FIG. 15). The through-holes 25a are formed in the adhesive tape 25 having a thickness the same as that of the thickness-adjusting sheet 16, and the adhesive tape 25 is attached to the intermediate sheet 14 (see FIG. 21). The unneeded portions of the intermediate sheet 14 and adhesive tape 25 are finally removed with the cutting blades 7 (see FIG. 22), thereby producing the anisotropic conductor 41.

Advantages; the anisotropic conductor 41 has the surfaces with the conductive contacts 13b, and the conductive sections 13b are formed so as to protrude from the surface to which the adhesive tape 25 is not provided. The conductive sections 13 can be therefore elastically deformed at this side with ease, and compressive load on the anisotropic conductor 41 can be accordingly reduced.

By virtue of the method of producing the anisotropic conductor 41, the conductive contacts 13b can be easily formed so as to protrude from the surface to which the adhesive tape 25 is not provided.

Figure 30:
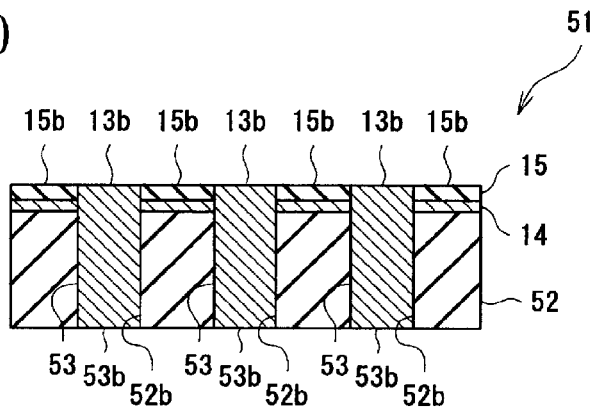
FIG. 30 is a cross-sectional view illustrating an anisotropic conductor of a fifth embodiment in the same manner as FIG. 2.

Fifth Embodiment [FIGS. 30 to 36]:

An anisotropic conductor 51 of this embodiment and a method of producing the anisotropic conductor 51 will be described with reference to FIGS. 30 to 36. FIG. 30 is a vertical cross-sectional view illustrating the anisotropic conductor 51, and FIGS. 31 to 36 each illustrate a method of producing the anisotropic conductor 51. The anisotropic conductor 51 of this embodiment has conductive sections 53 that are made from conductive rubber.

Configuration of Anisotropic Conductor 51; the anisotropic conductor 51 includes a base 52 having three through-holes 52b which are formed so as to penetrate the base 52 in the thickness direction. The conductive sections 53 are formed so as to penetrate the through-holes 52b. The base 52 has the two planar surfaces having the hole edges of the through-holes 52b.

The two ends of the individual conductive sections 53 are exposed from the base 52 to form conductive contacts 53b.

In this embodiment, conductive rubber is used to form the conductive sections 53, the conductive sections 53 may be formed as a result of continuously linking conductive materials together in the thickness direction as in the case of the conductive sections 13 of another embodiment.

Materials having a low electric resistance can be used as the conductor of the conductive sections 53, and metallic or carbon materials having an electric resistance of 1Ω or lower can be employed. Examples of such materials include, in addition to the magnetic conductive materials described above, good electrically conductive metals such as: metals including gold, silver, platinum, aluminum, copper, palladium, and chromium; and alloys such as stainless steel and brass. Furthermore, materials which are produced as a result of plating particles of resin or ceramic with good electrically conductive metals can be used. In terms of the shape of the conductor, materials may be used in the form of particle, fiber, or thin wire. Since a rubber elastic material in which such types of conductors are dispersed is not subjected to magnetic field orientation during the molding, the viscosity of the composition before the curing is not limited.

Figure 31:
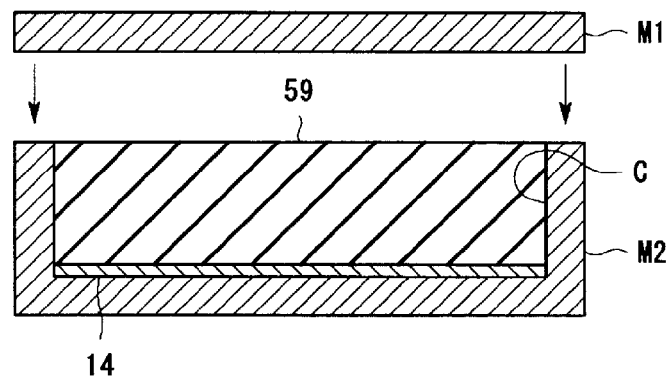
FIG. 31 illustrates a process in which the base-forming mold is closed in a method of producing the anisotropic conductor of the fifth embodiment.
Figure 32:
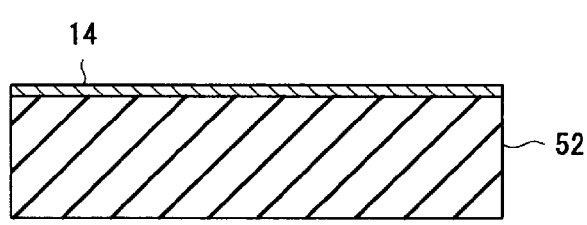
FIG. 32 illustrates a product demolded from the base-forming mold in the method of producing the anisotropic conductor of the fifth embodiment.
Figure 33:
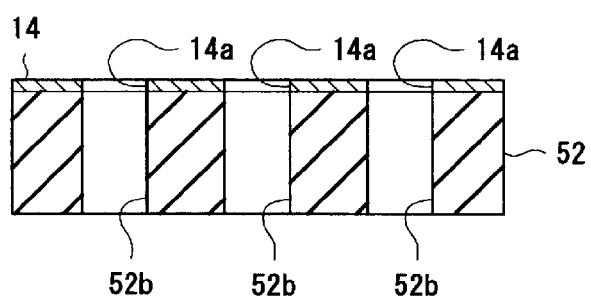
FIG. 33 illustrates the through-holes of a base and intermediate sheet in the method of producing the anisotropic conductor of the fifth embodiment.

Method of Producing Anisotropic Conductor 51; the base-forming upper mold M1 and lower mold M2 are prepared. As illustrated in FIG. 31, the intermediate sheet 14 is inserted into the lower mold M2 having the cavity C, a rubber composition 59 for the formation of the base 52 is then put thereinto, and the lower mold M2 is closed with the upper mold M1. Then, the rubber composition 59 is thermally cured to integrate the base 52 with intermediate sheet 14. The base 52 is subsequently demolded as illustrated in FIG. 32. As illustrated in FIG. 33, the through-holes 52b and the through-holes 14a are then formed so as to respectively penetrate the base 52 and intermediate sheet 14 in the thickness directions and so as to be in communication with each other.

Figure 34:
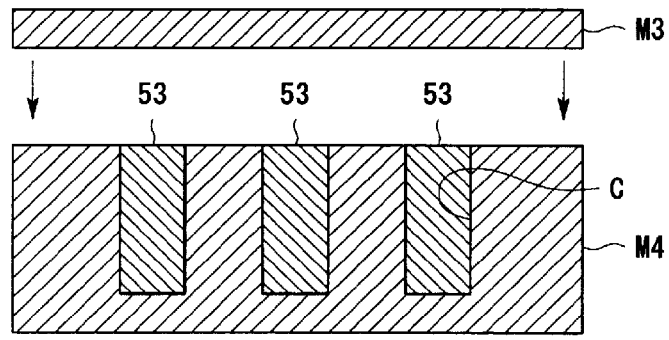
FIG. 34 illustrates a process in which the base-forming mold is closed in the method of producing the anisotropic conductor of the fifth embodiment.
Figure 35:
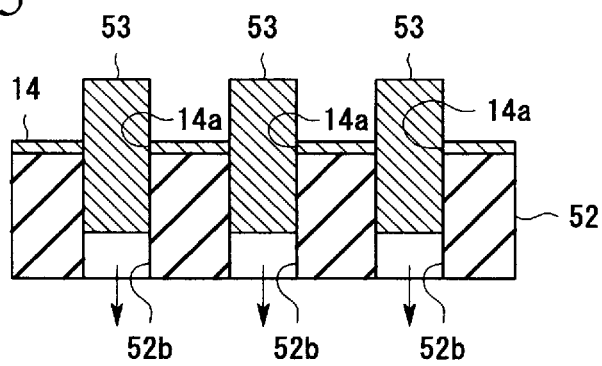
FIG. 35 illustrates a process of inserting conductive sections into the through-holes of the base and intermediate sheet in the method of producing the anisotropic conductor of the fifth embodiment.

The liquid rubber composition 58 and conductive section-forming upper mold M3 and lower mold M4 are prepared, the liquid rubber composition 58 being produced as a result of mixing a liquid polymer with a conductor. As illustrated in FIG. 34, the liquid rubber composition 58 is put into the lower mold M4 having the cavity C, and the lower mold M4 is then closed with the upper mold M3. Heat is applied to the conductive section-forming upper mold M1 and lower mold M2 to cure the liquid polymer of the liquid rubber composition 58, thereby forming the conductive sections 53. The conductive sections 53 are subsequently demolded.

Figure 36:
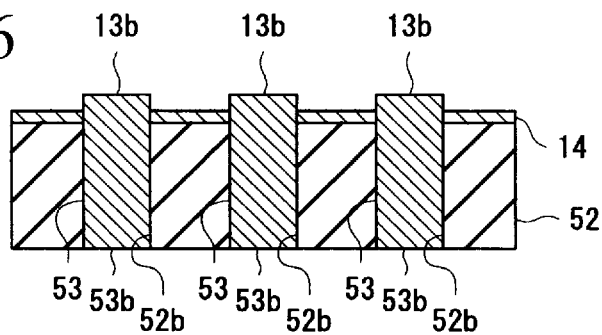
FIG. 36 illustrates a state in which the conductive sections have been inserted into the through-holes of the base and intermediate sheet in the method of producing the anisotropic conductor of the fifth embodiment.

Then, the conductive sections 53 are inserted into the through-holes 52b of the base 52 and the through-holes 14a of the intermediate sheet 14 as illustrated in FIG. 36, the through-holes 52b and 14a being in communication with each other. The conductive contacts 53b at the intermediate sheet 14-side ends of the conductive sections 53 are protruding from the intermediate sheet 14, and the conductive contacts 53b at the other ends of the conductive sections 53 are flush with the surface of the base 53. An adhesive material is finally applied onto the intermediate sheet 14 so as to have a thickness the same as that of the protrusions of the conductive sections 53 with the result that the adhesive section 15 is formed, thereby being able to form the anisotropic conductor 51.

In this case, in order to prevent the conductive sections 53 from being removed from the base 52, the conductive sections 53 may be configured so as to have an outer diameter larger than that of the through-holes 52a of the base 52 and inserted into the base 52 by application of pressure, or the conductive sections 53 may be produced by using a rubber elastic material which is the same rubber elastic material used for the base 52.

In another production method, the intermediate sheet 14 and the preliminarily prepared conductive sections 53 are put into the base-forming mold to form the base 52, the intermediate sheet 14 having the through-holes 14a which are formed at positions corresponding to the conductive sections 53. Owing to such a process, the base 52 can be integrated with the intermediate sheet 14 and conductive sections 53.

Advantages; as in the case of the anisotropic conductor 11, since the anisotropic conductor 51 has the intermediate sheet 14 which are positioned between the base 52 and adhesive section 15 and which adheres to the base 52, the material of the adhesive section 15 can be determined without the consideration for adhesive force to the base 52 in the case of fixing the anisotropic conductor 51 to objects to be fixed. An adhesive material that exhibits high adhesive force to the objects to be fixed can be therefore employed to form the adhesive section 15. The anisotropic conductor 51 which is less likely to cause misalignment with and removal from the objects to be fixed can be accordingly provided. Furthermore, since the intermediate sheet 14 is adhesively attached to the base 52, the hardness of the intermediate sheet 14 can make the base 52 difficult to deform, so that the anisotropic conductor 51 can be easily treated.

Since the conductive contacts 53b of the conductive sections 53 are formed so as to be flush with the adhesive surface 15b of the adhesive section 15, the surface of the anisotropic conductor 51 can uniformly contact with the surfaces of objects to be fixed without the formation of gaps. The conductive contacts 53b can therefore serve to stably secure conductive connection, and the adhesive surface 15b enables excellent adhesive force to be provided.

In the method of producing the anisotropic conductor 51, the adhesive section 15 is formed after the integration of the base 52 with the conductive sections 53, and the adhesive section 15 is therefore free from the effect of the thermal curing of the base 52. The adhesive force of the adhesive section 15 can be accordingly prevented from being decreased resulting from the thermal curing of the base 52.

Figure 37:
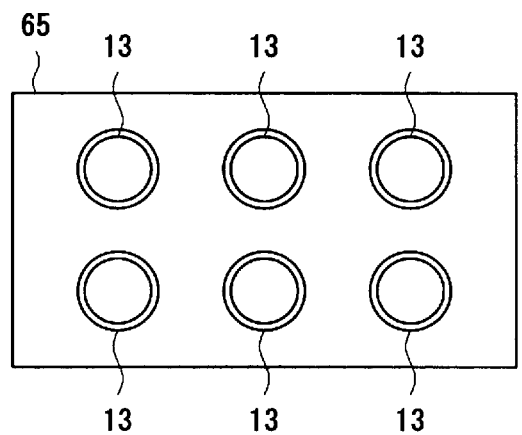
FIG. 37 is a plan view illustrating a modification of the anisotropic conductor of each of the embodiments.
Figure 38:
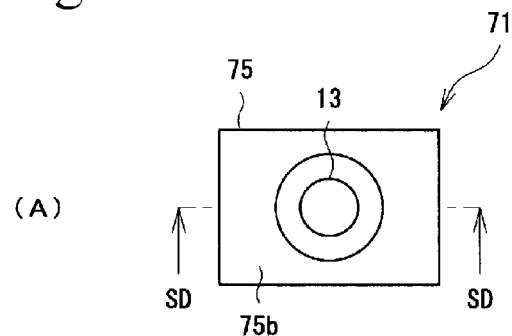
FIG. 38 illustrates another modification of the anisotropic conductor of each of the embodiments, a partial view (A) is a bottom view illustrating the anisotropic conductor, a partial view (B) is a cross-sectional view illustrating the anisotropic conductor taken along the line SD-SD, and a partial view (C) is a plan view illustrating the anisotropic conductor.
Figure 38:
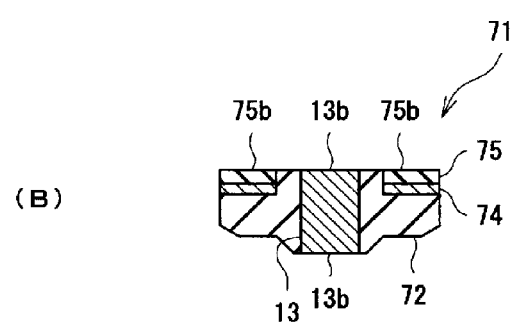
Figure 38:
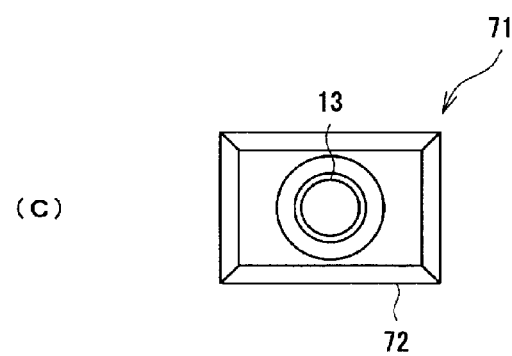

Modification [FIGS. 37 and 38]:

The number of the conductive sections included in a single anisotropic conductor can be appropriately changed. For instance, an anisotropic conductor 61 can be formed so as to have the conductive sections 13 in the manner of two rows and three columns as illustrated in FIG. 37 in plane view. The anisotropic conductor 61 includes an adhesive section 65 having six through-holes 65a in which the conductive sections 13 are exposed. Furthermore, an anisotropic conductor 71 can be formed so as to have a single conductive section 13 as illustrated in FIG. 38. The anisotropic conductor 71 illustrated in FIG. 38 can be produced in accordance with the above-described production method utilizing the magnetic field orientation so as to have a rectangular base 72 with a dimension of approximately 3 mm×2 mm in plane view.

Figure 39:
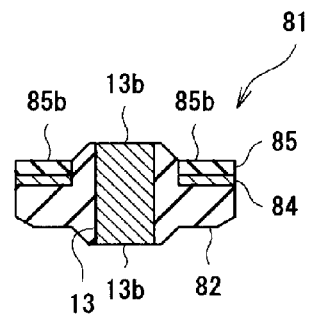
FIG. 39 illustrates another modification of the anisotropic conductor of each of the embodiments in the same manner as the partial view (B) in FIG. 38.
Figure 40:
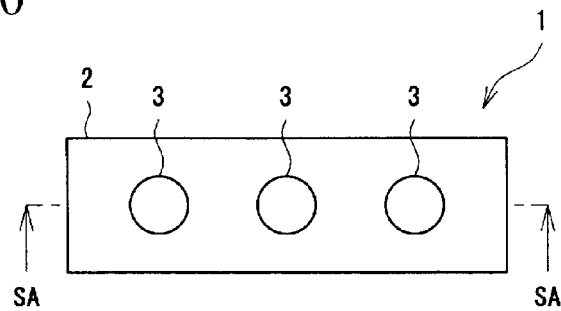
FIG. 40 is a plan view illustrating a traditional anisotropic conductive sheet.
Figure 41:
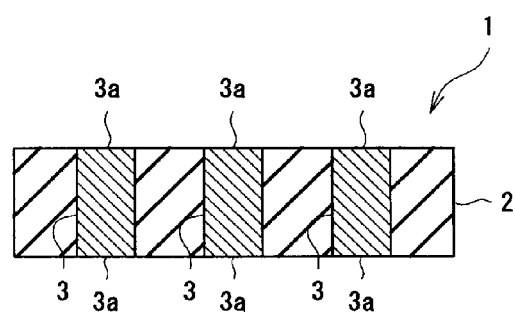
FIG. 41 is a cross-sectional view illustrating the anisotropic conductive sheet taken along the line SA-SA in FIG. 40.
Figure 42:
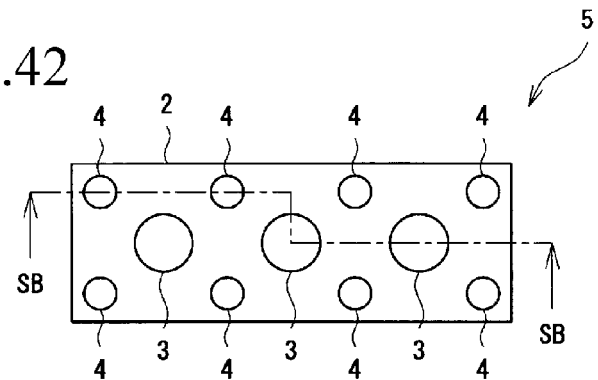
FIG. 42 is a plan view illustrating another traditional anisotropic conductive sheet.
Figure 43:
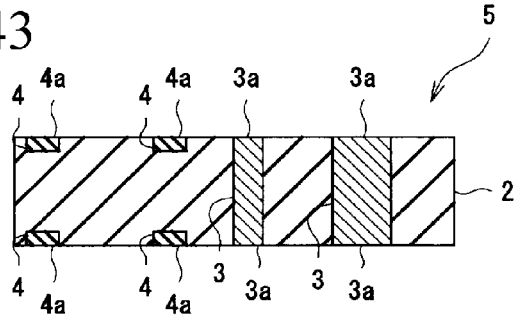
FIG. 43 is a cross-sectional view illustrating the anisotropic conductive sheet taken along the line SB-SB in FIG. 42.

The profile of the conductive sections-exposed surface of the anisotropic conductor can be also appropriately changed. As in the case of the conductive sections 13 or 53-exposed two surfaces of the anisotropic conductors 11, 21, 31, and 51, and as in the case of the adhesive section 25-provided surface of the anisotropic conductor 41, a flat surface may be formed, in which the conductive contacts in which the conductive sections are exposed are flush with the surface of the adhesive section or base. In addition, as in the case of the adhesive section 25-nonprovided surface of the anisotropic conductor 41, an uneven surface may be formed, in which the conductive sections are formed so as to protrude from the depressed surface as the depression 32a of the base 32. Furthermore, as in the case of the anisotropic conductor 71 illustrated in FIG. 38, an uneven surface may be formed, in which the conductive contact 13b is protruding from the base 72 and in which the corners of the base 72 are chamfered. Moreover, as illustrated in FIG. 39, the conductive contact 13b may be formed so as to protrude from the adhesive section 75b. In this case, the anisotropic conductor can be fixed to circuit boards or metallic cases in a state in which the conductive contact 13b is compressed by the adhesive force of the adhesive section 75b.

Meanwhile, a both-sided tape in which a substrate is not used can be utilized. The both-sided tape in which a substrate is not used is preferable in that an adhesive section can have a thinner thickness as compared with a both-sided tape in which a substrate is used.

The conductive section can be formed as a result of processing conductive metal into the shape (substantially column shape in the embodiments described above) of the conductive section. For example, metallic conductive sections may be formed in place of the conductive sections 53, which are produced from the conductive rubber, of the anisotropic conductor 51.

Moreover, as in the case of the anisotropic conductor 11, the anisotropic conductors 21, 31, 41, and 51 can be also used to form sheets on which anisotropic conductors 21, 31, 41, and 51 are arranged, respectively.

Each of the embodiments described above is nothing about an embodiment of the invention, and the components of each of the embodiments can be appropriately changed. For instance, an anisotropic conductor can be produced so as to include a structure illustrated in FIG. 23 and a structure illustrated FIG. 30 in combination, the former having the adhesive sections 25 on the two surfaces of the base 32 of the anisotropic conductor 31 of the third embodiment, the latter having the conductive sections 53, which is produced from the conductive rubber, of the anisotropic conductor 51 of the fifth embodiment.

EXAMPLE

In the following example, the adhesive force of the adhesive section was tested.

1. Production of Samples: a both-sided tape of acrylic resin having adhesive layers was served as an adhesive tape and was attached to a polyethylene terephthalate resin film as an intermediate sheet having a length of 200 mm, a width of 25 mm, and a thickness of 0.1 mm. An aluminum plate as an object to be fixed was attached to the both-sided tape at a load of 1600 gf, thereby producing a specimen.

Sample 1: the specimen was left to stand for one hour after being produced, thereby producing a sample 1.

Sample 2: the specimen was left to stand for one hour after being produced. The resultant product was heated at a temperature of 150° C. for 1 hour, thereby producing a sample 2.

2. Test Method: the samples 1 and 2 were subjected to "180° peel adhesion test in accordance with JIS Z 0237", and the adhesive force of each of the samples was then evaluated. The test results are listed in Table 1.

In "180° peel adhesion test in accordance with JIS Z 0237", the ends of both of the polyethylene terephthalate resin film and aluminum plate were disposed between the probes of a tension tester and were pulled at a tension rate of 300 mm/min in a 180° direction (opposite direction). Then, a load was measured at the time of removal of the samples. The test was conducted three times for each sample. The average values of the test results are listed in Table 1.

3. Test Results: it was found that the sample 2 had an adhesive force lower than that of the sample 1. It was believed that the heat applied to the sample 2 caused the adhesive force to be decreased.

TABLE 1

| | Heating | Adhesive force (N) | Removed interface |
|---|---|---|---|
| Sample 1 | Absence | 23.75 | between adhesive layer and aluminum plate |
| Sample 2 | 150° C. for 1 hour | 15.71 | between adhesive layer and aluminum plate |

REFERENCE SIGNS LIST

1 Anisotropic conductive sheet (anisotropic conductor, traditional technique)
2 Base
3 Conductive section
   3a Conductive contact
Adhesive section
   4a Adhesive surface
5 Anisotropic conductive sheet (anisotropic conductor, traditional technique)
6 Magnet
7 Cutting blade
8 Probe
9 Test substrate
   9a Electrode
10 Film sheet
   10a Inspection hole
11 Anisotropic conductor (first embodiment)
12 Base
   12a Depression
13 Conductive section
   13a Magnetic conductive particle
   13b Conductive contact
14 Intermediate sheet
   14a Through-hole
15 Adhesive section
   15a Through-hole
   15b Adhesive surface
16 Thickness-adjusting sheet
   16a Through-hole
17 First processing sheet
   17a Through-hole
18 Liquid rubber composition
19 Sealing sheet
20 Second processing sheet
21 Anisotropic conductor (second embodiment)
25 Adhesive section (adhesive tape)
   25a Through-hole
   25b Adhesive surface
   25c Substrate
   25d Adhesive layer
31 Anisotropic conductor (third embodiment)
32 Base
   32a Depression
41 Anisotropic conductor (fourth embodiment)
51 Anisotropic conductor (fifth embodiment)
52 Base
   52a Through-hole
53 Conductive section
   53b Conductive contact 58 Liquid rubber composition
59 Rubber composition
61 Anisotropic conductor (modification common to each embodiment)
65 Adhesive section
65a Through-hole
71 Anisotropic conductor (another modification common to each embodiment)
72 Base
74 Intermediate sheet
75 Adhesive section
75b Adhesive surface
81 Anisotropic conductor (another modification common to each embodiment)
82 Base
84 Intermediate sheet
85 Adhesive section
85b Adhesive surface
91 Voltmeter
92 Constant-current power source
C Cavity
M1 Upper mold (used for base formation)
M2 Lower mold (used for base formation)
M3 Upper mold (used for conductive section formation)
M4 Lower mold (used for conductive section formation)
P Orientation pin
R Gap

The invention claimed is:

1. An anisotropic conductor comprising:
an insulating base that is formed by using a rubber elastic material;
a conductive section that penetrates the base in the thickness direction, the conductive section being exposed from the base to form a conductive contact; and
an adhesive section that is exposed from the conductive contact-formed surface of the base to form an adhesive surface,
wherein an intermediate sheet is provided between the base and the adhesive section, the intermediate sheet exhibiting adhesiveness to the base, and has a substantially same size in plan view as that of the adhesive section.

2. The anisotropic conductor according to claim 1, wherein the intermediate sheet is formed by using a heat-resistant curing resin that exhibits a deflection temperature under load of at least 170° C., the temperature being measured in accordance with JIS K 7191.

3. The anisotropic conductor according to claim 1, wherein the adhesive section is an adhesive tape having a substrate and adhesive layers provided on the two surfaces of the substrate.

4. The anisotropic conductor according to claim 1, wherein the adhesive surface is formed so as to be flush with the conductive contact.

5. A method of producing the anisotropic conductor according to claim 1 comprising:
forming a first processing sheet having a structure in which a thickness-adjusting sheet is stacked on the intermediate sheet, the first processing sheet having a through-hole that penetrates the both sheets in the thickness direction;
inserting the first processing sheet into a mold in which an orientation pin is embedded, while the through-hole is aligned with the orientation pin of the mold and the thickness-adjusting sheet faces the mold;
putting a liquid rubber composition containing a magnetic conductor into the mold, applying a magnetic field to the mold in order to form the conductive section that extends through the through-hole, and then heating the mold to cure the liquid rubber composition with the result that the base is integrated with the first processing sheet; and
removing the thickness-adjusting sheet and then providing the adhesive section in a region formed by the removal.

6. The method of producing the anisotropic conductor according to claim 5, further comprising:
stacking a sealing sheet on the thickness-adjusting sheet of the first processing sheet to form a second processing sheet, and
removing the thickness-adjusting sheet and the sealing sheet in the formation of the adhesive section.

7. The method of producing the anisotropic conductor according to claim 5, wherein any one of the first processing sheet and second processing sheet is inserted into a planar surface of the mold in order to form the adhesive surface which is flush with the conductive contact, the adhesive surface being provided in a region formed by the removal of the thickness-adjusting sheet.

8. The method of producing the anisotropic conductor according to claim 5, wherein the adhesive section is formed by using an adhesive tape having a substrate and adhesive layers provided on the two surfaces of the substrate.

9. The method of producing the anisotropic conductor according to claim 8, wherein the thickness-adjusting sheet has a thickness the same as that of the adhesive tape.

10. An anisotropic conductor-arranged sheet comprising: the anisotropic conductor of claim 1; and a film sheet on which a plurality of the anisotropic sheets are arranged.

11. An anisotropic conductor-arranged sheet comprising: the anisotropic conductor of claim 1; and a film sheet on which a plurality of the anisotropic sheets are arranged, wherein
the film sheet has an inspection hole that is formed so as to correspond to the conductive section of the anisotropic conductor.

12. An anisotropic conductor-arranged sheet comprising: the anisotropic conductor of claim 1; and a film sheet on which a plurality of the anisotropic sheets are arranged, wherein
the anisotropic conductors are alternately arranged on the film sheet in longitudinal and lateral directions.

13. An anisotropic conductor-arranged sheet comprising: the anisotropic conductor of claim 1; and a film sheet on which a plurality of the anisotropic sheets are arranged, wherein
the anisotropic conductors are arranged on the film sheet such that the edge of one anisotropic conductor is spaced apart from the edges of the other adjacent anisotropic conductors.

* * * * *